United States Patent
Kim et al.

(10) Patent No.: US 12,002,764 B2
(45) Date of Patent: Jun. 4, 2024

(54) INTEGRATED CIRCUIT DEVICE AND ELECTRONIC SYSTEM INCLUDING THE SAME

(71) Applicant: SAMSUNG ELECTRONICS CO., LTD., Suwon-si (KR)

(72) Inventors: Jongsoo Kim, Seoul (KR); Juyoung Lim, Seoul (KR); Sunil Shim, Seoul (KR); Wonseok Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 393 days.

(21) Appl. No.: 17/529,941

(22) Filed: Nov. 18, 2021

(65) Prior Publication Data

US 2022/0246537 A1    Aug. 4, 2022

(30) Foreign Application Priority Data

Feb. 2, 2021    (KR) ......................... 10-2021-0014972

(51) Int. Cl.
*H01L 23/544* (2006.01)
*H10B 41/10* (2023.01)
(Continued)

(52) U.S. Cl.
CPC .......... *H01L 23/544* (2013.01); *H10B 41/10* (2023.02); *H10B 41/27* (2023.02); *H10B 41/35* (2023.02); *H10B 41/41* (2023.02); *H10B 43/10* (2023.02); *H10B 43/27* (2023.02); *H10B 43/35* (2023.02); *H10B 43/40* (2023.02); *G11C 16/0483* (2013.01); *H01L 2223/54426* (2013.01)

(58) Field of Classification Search
CPC ......... H01L 23/544; H01L 2223/54426; H01L 2223/54453; H01L 23/5226; H01L 23/5283; H10B 41/10; H10B 41/27; H10B 41/35; H10B 41/41; H10B 43/10; H10B 43/27; H10B 43/35; H10B 43/40; H10B 41/50; H10B 43/50; H11C 16/0483; G11C 5/025; G11C 2029/0411
USPC ........................................................ 257/314
See application file for complete search history.

(56) References Cited

U.S. PATENT DOCUMENTS 8,653,585 B2    2/2014  Youm et al.
10,332,788 B2   6/2019  Noh
(Continued)

FOREIGN PATENT DOCUMENTS

KR    20070110629 A    11/2007
KR    20140063145 A    5/2014

*Primary Examiner* — Tan N Tran
(74) *Attorney, Agent, or Firm* — Myers Bigel, P.A.

(57) ABSTRACT

An integrated circuit device comprising a base structure, a gate stack on the base structure and comprising a plurality of gate electrodes spaced apart from each other, a first upper insulating layer on the gate stack, a plurality of channel structures that penetrate the gate stack, each of the plurality of channel structures comprises a respective alignment key protruding from the gate stack, a second upper insulating layer that overlaps the respective alignment key of each of the plurality of channel structures, a top supporting layer on the second upper insulating layer, a bit line on the top supporting layer, and a plurality of bit line contacts that electrically connect respective ones of the plurality of channel structures to the bit line. A sidewall of the first upper insulating layer includes a first step.

20 Claims, 25 Drawing Sheets

(51) Int. Cl.
*H10B 41/27* (2023.01)
*H10B 41/35* (2023.01)
*H10B 41/41* (2023.01)
*H10B 43/10* (2023.01)
*H10B 43/27* (2023.01)
*H10B 43/35* (2023.01)
*H10B 43/40* (2023.01)
*G11C 16/04* (2006.01)

(56) References Cited

U.S. PATENT DOCUMENTS

| | | |
|---|---|---|
| 10,418,374 B2 | 9/2019 | Lee et al. |
| 10,490,564 B2 | 11/2019 | Mushiga et al. |
| 11,374,017 B2 * | 6/2022 | Kanamori ............... H10B 43/27 |
| 2016/0268290 A1 | 9/2016 | Matsunaga et al. |

* cited by examiner

INTEGRATED CIRCUIT DEVICE AND ELECTRONIC SYSTEM INCLUDING THE SAME

CROSS-REFERENCE TO RELATED APPLICATIONS

This application is based on and claims priority under 35 U.S.C. § 119 to Korean Patent Application No. 10-2021-0014972, filed on Feb. 2, 2021, in the Korean Intellectual Property Office, the disclosure of which is incorporated by reference herein in its entirety.

BACKGROUND

The inventive concept relates to an integrated circuit device and an electronic system including the same, and more particularly, to an integrated circuit device having a non-volatile vertical memory device, and an electronic system including the integrated circuit device.

There is a demand for integrated circuit devices capable of storing data of high capacity in an electronic system that need data storage. To increase a data storage capacity of an integrated circuit device, integration of the integrated circuit device may be increased. In particular, the integration of a memory device may be an important factor of determining economic feasibility of a product. The integration of a two-dimensional memory device is mainly determined according to an area occupied by a unit memory cell, and thus is greatly affected by a level of a fine patterning technology. However, equipment necessary for forming a fine pattern is expensive and an area of a chip die is limited, and thus, the integration of two-dimensional memory devices has increased in a limited manner. Thus, there has been a demand for a vertical memory device having a three-dimensional structure.

SUMMARY

The inventive concept provides an integrated circuit device and an electronic system including the integrated circuit device.

According to the inventive concept, an integrated circuit device comprises a base structure, a gate stack on the base structure and including a plurality of gate electrodes spaced apart from each other in a first direction perpendicular to a main surface of the base structure, a first upper insulating layer on the gate stack, a plurality of channel structures that penetrate the gate stack and contact the base structure. Each of the plurality of channel structures include a respective alignment key that protrudes from the gate stack. The integrated circuit device includes a second upper insulating layer in a key opening of the first upper insulating layer and overlaps the respective alignment key of each of the plurality of channel structures, a top supporting layer on the second upper insulating layer, a bit line on the top supporting layer, and a plurality of bit line contacts that penetrate the second upper insulating layer and the top supporting layer and electrically connect respective ones of the plurality of channel structures to the bit line. A sidewall of the first upper insulating layer includes a first step.

According to the inventive concept, an integrated circuit device includes a base structure, a gate stack on the base structure and including a plurality of gate electrodes spaced apart from each other in a first direction perpendicular to a main surface of the base structure, a plurality of channel structures that penetrate the gate stack and contact the base structure. Each of the plurality of channel structures includes a respective alignment key that protrudes from the gate stack. The integrate circuit device includes a first upper insulating layer on the gate stack, the first upper insulating layer includes a key opening that overlaps the plurality of channel structures in the first direction. The integrate circuit device includes a second upper insulating layer in the key opening of the first upper insulating layer. The second upper insulating layer overlaps the respective alignment key of each of the plurality of channel structures. The second upper insulating layer includes a recessed portion at an upper side thereof. The integrate circuit device includes a buried insulating pattern in the recessed portion of the second upper insulating layer, a top supporting layer on the second upper insulating layer and that is on the buried insulating pattern, a bit line on the top supporting layer, and a plurality of bit line contacts that penetrate the second upper insulating layer, the buried insulating pattern, and the top supporting layer. Respective ones of the plurality of bit line contacts electrically connect respective ones of the plurality of channel structures to the bit line.

According to the inventive concept, an electronic system includes a main substrate, an integrated circuit device on the main substrate, and a controller on the main substrate and is electrically connected to the integrated circuit device. The integrated circuit device includes a base structure, a peripheral circuit structure on the base structure, an input/output pad electrically connected to the peripheral circuit structure, a gate stack on the peripheral circuit structure and includes a plurality of gate electrodes spaced apart from each other in a first direction perpendicular to a main surface of the base structure, a plurality of channel structures that extend in the first direction and penetrate the gate stack, each of the plurality of channel structures includes a respective alignment key that protrudes from the gate stack, a first upper insulating layer on the gate stack and includes a key opening that overlaps the plurality of channel structures in the first direction. A sidewall of the key opening includes a first step. The integrated circuit device includes a second upper insulating layer in the key opening of the first upper insulating layer, and is on the respective alignment key of each of the plurality of channel structures, a top supporting layer on the second upper insulating layer, a bit line on the top supporting layer, and a plurality of bit line contacts that penetrate the second upper insulating layer and the top supporting layer and electrically connect respective ones of the plurality of channel structures to the bit line.

BRIEF DESCRIPTION OF THE DRAWINGS

Embodiments of the inventive concept will be more clearly understood from the following detailed description taken in conjunction with the accompanying drawings in which.

DETAILED DESCRIPTION

Hereinafter, embodiments of the inventive concept will be described in detail with reference to the accompanying drawings.

Figure 1:
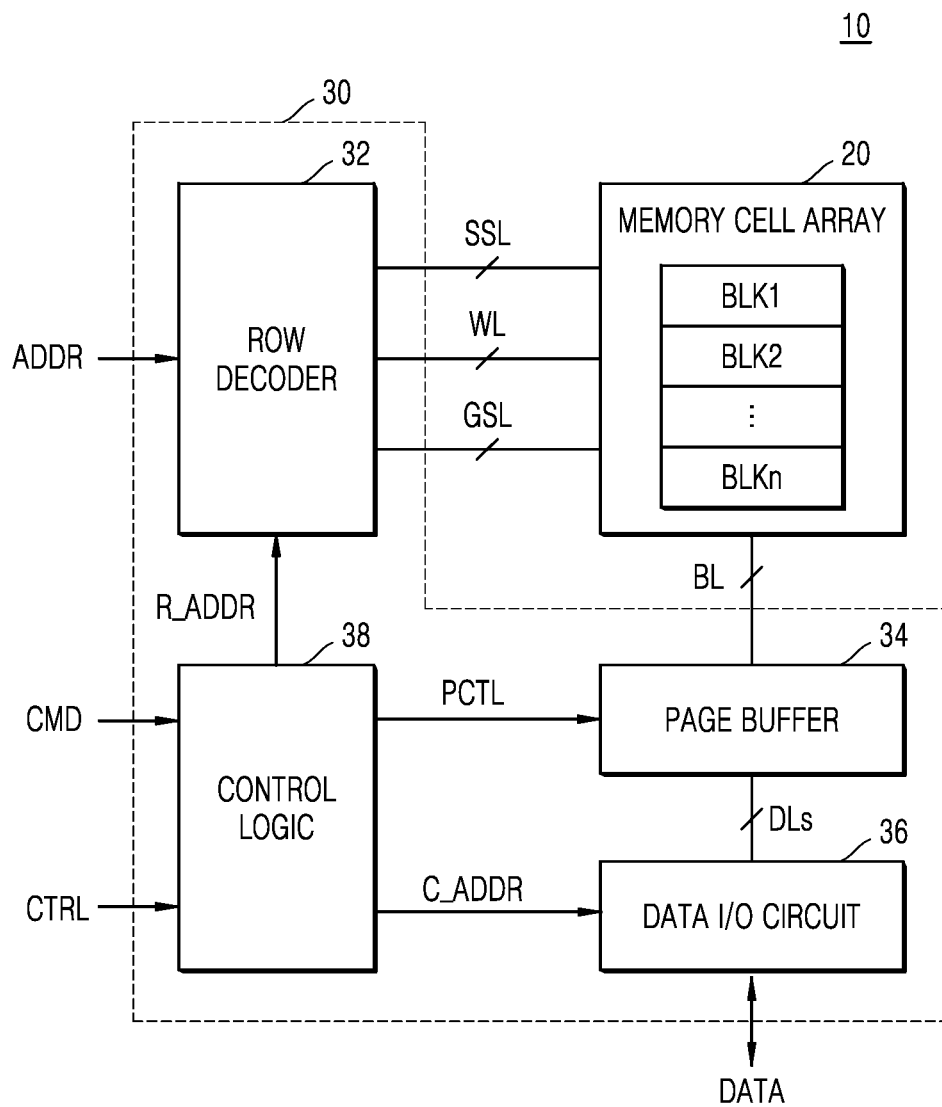
FIG. 1 is a block diagram of an integrated circuit device according to example embodiments of the inventive concept.

FIG. 1 is a block diagram of an integrated circuit device 10 according to example embodiments of the inventive concept.

Referring to FIG. 1, the integrated circuit device 10 may include a memory cell array 20 and a peripheral circuit 30.

The memory cell array 20 may include a plurality of memory cell blocks BLK1, BLK2, ..., BLKn. Each of the plurality of memory cell blocks BLK1, BLK2, ..., BLKn may include a plurality of memory cells. The plurality of memory cell blocks BLK1, BLK2, ..., BLKn may be connected to the peripheral circuit 30 through a bit line BL, a word line WL, a string select line SSL, and a ground select line GSL.

The memory cell array 20 may be connected to a page buffer 34 through the bit line BL, and may be connected to a row decoder 32 through the word line WL, the string select line SSL, and the ground select line GSL. In the memory cell array 20, the plurality of memory cells included in the plurality of memory cell blocks BLK1, BLK2, ..., BLKn may be flash memory cells. The memory cell array 20 may include a three-dimensional memory cell array. The three-dimensional memory cell array may include a plurality of NAND strings, and each of the plurality of NAND strings may include a plurality of memory cells connected to a plurality of word lines WL that are each stacked vertically.

The peripheral circuit 30 may include the row decoder 32, the page buffer 34, a data input/output circuit 36, and a control logic 38. Although not shown, the peripheral circuit 30 may further include various circuits, such as a voltage generation circuit configured to generate various voltages necessary for operations of the integrated circuit device 10, an error correction circuit for correcting errors of data read from the memory cell array 20, and an input/output interface.

The peripheral circuit 30 may receive an address ADDR, a command CMD, and a control signal CTRL from the outside of the integrated circuit device 10, and transmit or receive data DATA to or from a device outside of the integrated circuit device 10.

Elements of the peripheral circuit 30 are described in detail below.

The row decoder 32 may select at least one of the plurality of memory cell blocks BLK1, BLK2, ..., BLKn in response to the address ADDR from the outside, and select a word line WL, a string select line SSL, and a ground select line GSL of the selected memory cell block. The row decoder 32 may transfer a voltage to the word line WL of the selected memory cell block to perform a memory operation.

The page buffer 34 may be connected to the memory cell array 20 through the bit line BL. When a program is running, the page buffer 34 may operate as a write driver to apply, to the bit line BL, a voltage according to data DATA to be stored in the memory cell array 20, and when a read operation is performed, the page buffer 34 may operate as a detection amplifier to detect the data DATA stored in the memory cell array 20. The page buffer 34 may be operated according to a control signal PCTL received from the control logic 38.

The data input/output circuit 36 may be connected to the page buffer 34 through data lines DLs. When a program is running, the data input/output circuit 36 may receive data DATA from a memory controller (not shown) and provide the program data DATA to the page buffer 34 based on a column address C_ADDR received from the control logic 38. When a reading operation is performed, the data input/output circuit 36 may provide, to the memory controller, read data DATA stored in the page buffer 34, based on the column address C_ADDR received from the control logic 38. The data input/output circuit 36 may transfer an input address or an input command to the control logic 38 or the row decoder 32.

The control logic 38 may receive a command CMD and a control signal CTRL from the memory controller. The control logic 38 may provide a row address R_ADDR to the row decoder 32 and the column address C_ADDR to the data input/output circuit 36. In response to the control signal CTRL, the control logic 38 may generate various internal control signals used in the integrated circuit device 10. For example, when performing a memory operation such as a program operation, an erase operation, or the like, the control logic 38 may control a voltage level applied to the word line WL and the bit line BL.

Figure 2:
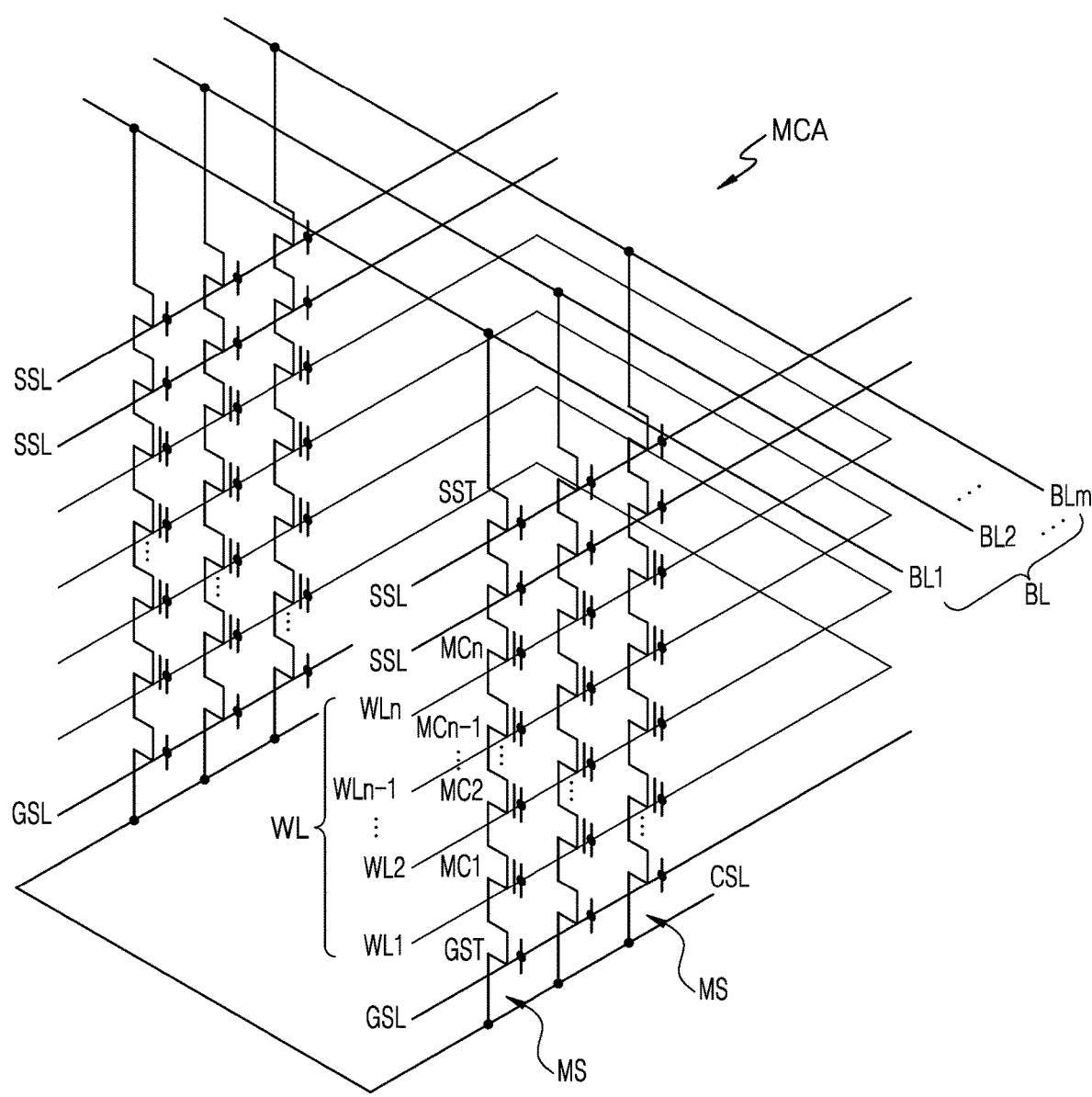
FIG. 2 is an equivalent circuit diagram of a memory cell array of an integrated circuit device according to example embodiments of the inventive concept.

FIG. 2 is an equivalent circuit diagram of a memory cell array of an integrated circuit device according to example embodiments of the inventive concept.

Referring to FIG. 2, an equivalent circuit diagram of a vertical NAND flash memory device having a vertical channel structure is shown as an example.

A memory cell array MCA may include a plurality of memory cell strings MS. The memory cell array MCA may include a plurality of bit lines BL, a plurality of word lines WL, at least one string select line SSL, at least one ground select line GSL, and a common source line CSL.

The plurality of memory cell strings MS may be formed between the plurality of bit lines BL and the common source line CSL. In FIG. 2, each of the plurality of memory cell strings MS includes two string select lines SSL, but the inventive concept is not limited thereto. For example, each of the plurality of memory cell strings MS may include one string select line SSL.

Each of the plurality of memory cell strings MS may include a string select transistor SST, a ground select transistor GST, and a plurality of memory cell transistors MC1, MC2, ..., MCn−1, and MCn. A drain area of the string select transistor SST may be connected to the bit line BL and a source area thereof to the common source line CSL. The common source line CSL may include an area to which source areas of a plurality of ground select transistors GST are commonly connected.

The string select transistor SST may be connected to the string select line SSL, and the ground select transistor GST may be connected to the ground select line GSL. The plurality of memory cell transistors MC1, MC2, . . . , MCn−1, and MCn may be connected to the plurality of word lines WL, respectively.

Figure 3:
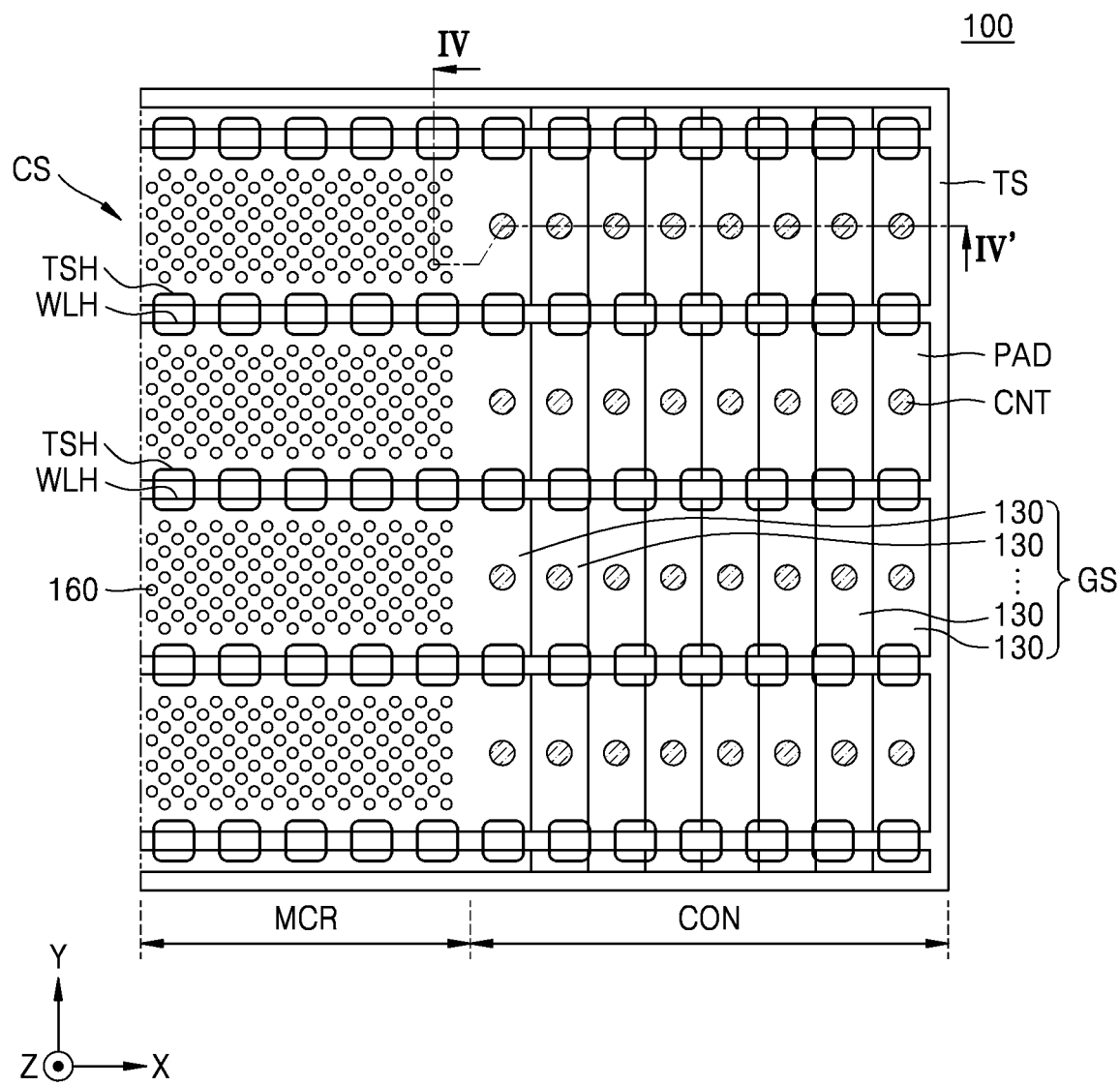
FIG. 3 is a plan view of main elements of an integrated circuit device according to example embodiments of the inventive concept.
Figure 4:
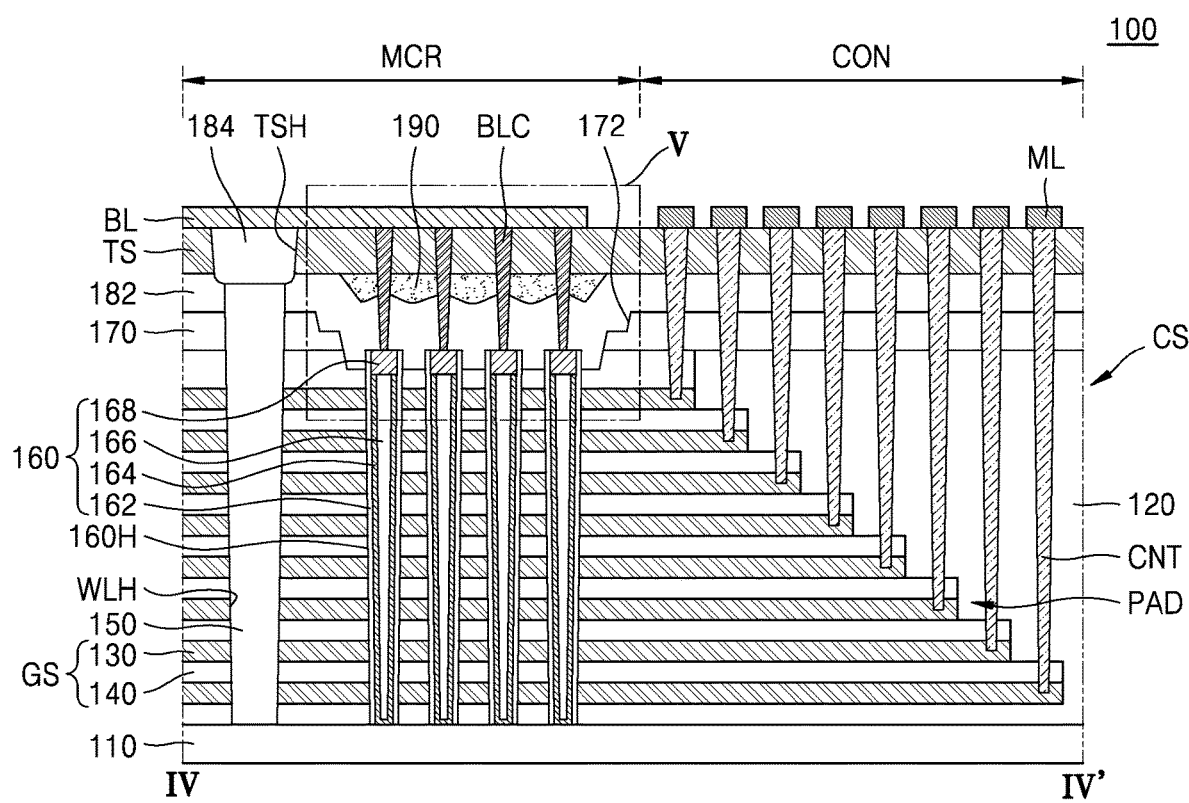
FIG. 4 is a cross-sectional view of the integrated circuit device in FIG. 3, taken along line IV-IV.
Figure 5:
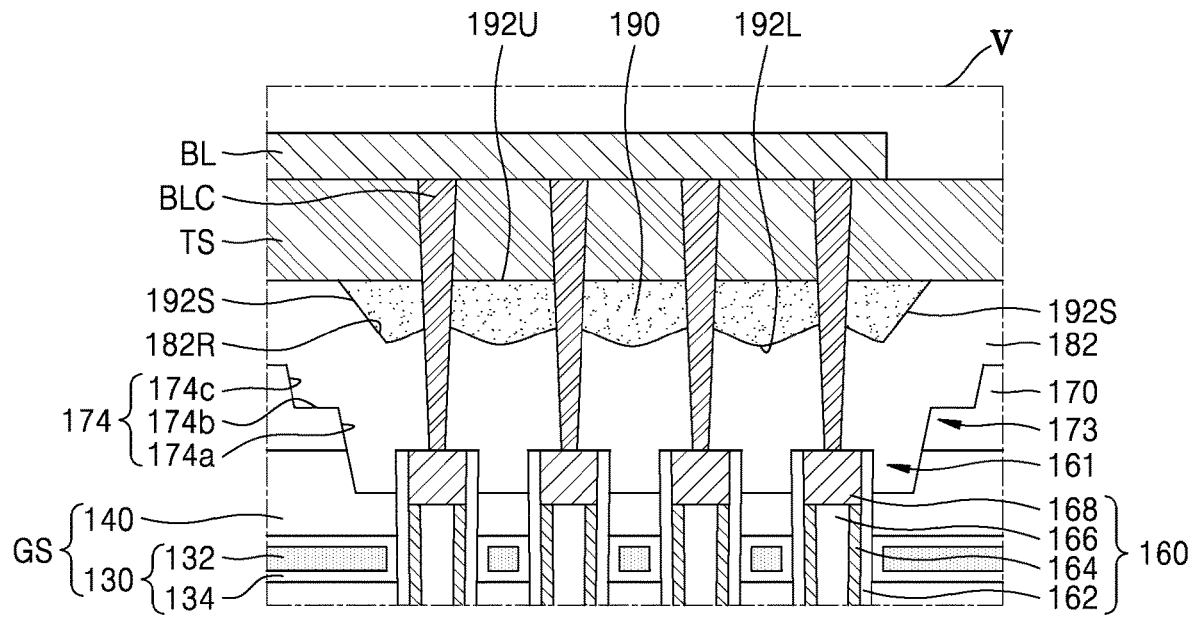
FIG. 5 is an enlarged view of an area "V" in FIG. 4.

FIG. 3 is a plan view of main elements of an integrated circuit device 100 according to example embodiments of the inventive concept. FIG. 4 is a cross-sectional view of the integrated circuit device 100 in FIG. 3, taken along line IV-IV'. FIG. 5 is an enlarged view of an area "V" in FIG. 4.

Referring to FIGS. 3 to 5, the integrated circuit device 100 may include a cell array structure CS including a memory cell region MCR and a connection region CON.

The memory cell region MCR may include an area in which the NAND-type memory cell array MCA having a vertical channel structure described above with reference to FIG. 2, is formed. The connection region CON may include an area in which a pad portion PAD for electrically connecting the memory cell array MCA formed in the memory cell region MCR and a peripheral circuit region (not shown) to each other.

A base structure 110 may include a semiconductor substrate. The semiconductor substrate may include a semiconductor material, for example, a Group IV semiconductor, a Group III-V compound semiconductor, or a Group II-VI oxide semiconductor. For example, the Group IV semiconductor may include silicon (Si), germanium (Ge), or silicon-germanium. The semiconductor substrate may be provided as a wafer in which a bulk wafer or an epitaxial layer is formed. In other embodiments, the semiconductor substrate may include a silicon on insulator (SOI) substrate or a germanium-on-insulator (GeOI) substrate. In some example embodiments, the base structure 110 may include a lower base layer and an upper base layer that are vertically stacked. In this case, the lower base layer may include a metal material such as tungsten (W), and the upper base layer may include a semiconductor layer such as silicon.

On the base structure 110, a gate stack GS may extend in a first direction (an X direction) parallel to a main surface of the base structure 110 and a second direction (a Y direction). The gate stack GS may include a plurality of gate electrodes 130 and a plurality of insulating layers 140, and the plurality of gate electrodes 130 and the plurality of insulating layers 140 may be alternately arranged in a third direction (a Z direction) perpendicular to an upper surface of the base structure 110.

The gate electrode 130 may include a buried conductive layer 132 and an insulating liner 134 covering or on an upper surface, a bottom surface, and a side surface of the buried conductive layer 132. For example, the buried conductive layer 132 may include a metal such as tungsten, a metal silicide such as tungsten silicide, doped polysilicon, or any combinations thereof. In some embodiments, the insulating liner 134 may include a high-k dielectric material such as aluminum oxide.

The plurality of gate electrodes 130 may correspond to the ground select line GSL, the word line WL, and the at least one string select line SSL of the memory cell string MS described above with reference to FIG. 2. For example, the gate electrode 130 of the lowermost layer may function as the ground select line GSL, the gate electrode 130 of the uppermost layer may function as the string select line SSL, and the remaining gate electrode 130 may function as the word line WL. Accordingly, the memory cell string MS may include the ground select transistor GST, the string select transistor SST, and the memory cell transistors MC1, MC2, . . . , MCn−1, and MCn therebetween that are connected in series to each other.

A plurality of word line cuts 150 for filling a word line cut opening WLH may be arranged on the base structure 110. The plurality of word line cuts 150 may extend in the first direction (the X direction). The plurality of word line cuts 150 may extend in the third direction (the Z direction) from the base structure 110. The gate stack GS arranged between a pair of word line cuts 150 may constitute one block, and the pair of word line cuts 150 may limit a width in the second direction (the Y direction) of the gate stack GS. The word line cut 150 may have an insulating structure. The word line cut 150 may include silicon oxide, silicon nitride, silicon oxynitride, or a low-k dielectric material. For example, the word line cut 150 may include a silicon oxide layer, a silicon nitride layer, silicon oxynitride (SiON), silicon oxycarbide (SiOC), silicon carbonitride (SiCN), or any combinations thereof.

A plurality of channel structures 160 may extend in the third direction (the Z direction) from the upper surface of the base structure 110 via the gate electrode 130 in the memory cell region MCR. The plurality of channel structures 160 may be spaced apart from each other at certain intervals in the first direction (the X direction) and the second direction (the Y direction). The plurality of channel structures 160 may be arranged in a zigzag shape or a staggered shape.

The plurality of channel structures 160 may extend in the third direction (the Z direction) via the gate stack GS. The plurality of channel structures 160 may be filled in a channel hole 160H that penetrates through the gate stack GS. Each of the plurality of channel structures 160 may include a gate insulating layer 162, a channel layer 164, a buried insulating layer 166, and a conductive plug 168. The gate insulating layer 162 and the channel layer 164 may be sequentially arranged on a sidewall of the channel hole 160H. For example, the gate insulating layer 162 may be arranged on the side surface of the channel hole 160H in a conformal manner, and the channel layer 164 may be arranged on the bottom portion of the sidewall of the channel hole 160H in a conformal manner. The buried insulating layer 166 with which a remaining space of the channel hole 160H is filled may be disposed on the channel layer 164. In a plan view, the channel layer 164 may surround the buried insulating layer 166. The conductive plug 168 contacting the channel layer 164 and blocking an inlet (for example, the uppermost end) of the channel hole 160H may be arranged over the channel hole 160H. In other embodiments, the buried insulating layer 166 may be omitted, and the channel layer 164 may fill the remaining portion of the channel hole 160H, inside a cylindrical shape formed by the gate insulating layer 162 in a plan view. In this case, the channel layer 164 may have a pillar shape.

The plurality of channel structures 160 may contact the base structure 110. In some embodiments, the channel layer 164 may contact the upper surface of the base structure 110 at the bottom portion of the channel hole 160H. In other embodiments, a contact semiconductor layer (not shown) having a certain height from the base structure 110 may be formed on the bottom surface of the channel hole 160H, and the channel layer 164 may be electrically connected to the base structure 110 via the contact semiconductor layer. In other embodiments, the bottom surface of the channel layer 164 may be arranged at a level vertically lower than the upper surface of the base structure 110.

In example embodiments, each of the plurality of channel structures 160 may include an alignment key 161 protruding from the uppermost insulating layer 140 in the gate stack GS. The alignment key 161 may refer to a portion of each of the channel structures 160 protruding from the uppermost insulating layer 140. The alignment key 161 may include a portion of the conductive plug 168 and the gate insulating layer 162 surrounding the portion of the conductive plug 168 in a plan view. For example, the uppermost insulating layer 140 includes, at an upper side thereof, a recessed portion recessed from a peripheral portion, and a plurality of alignment keys 161 of the plurality of channel structures 160 may be in the recessed portion of the uppermost insulating layer 140. In a manufacturing process of the integrated circuit device 100, the plurality of alignment keys 161 of the plurality of channel structures 160 may be used as an alignment structure for a photolithography process. For example, the plurality of alignment keys 161 of the plurality of channel structures 160 may be used as an alignment structure for forming a mask pattern that is used to form the word line cut opening WLH. A bottom surface of the alignment key 161 may be lower than a top surface of the conductive plug 168, but higher than a bottom portion of the conductive plug 168 with respect to the substrate or base structure 110. A bottom surface of the alignment key 161 may be lower than a top surface of the gate insulating layer 162 of the channel structure 160.

The gate insulating layer 162 may have a structure in which a tunneling dielectric layer, a charge storage layer, and a blocking dielectric layer are sequentially arranged on the outer sidewall of the channel layer 164. The tunneling dielectric layer may include silicon oxide, hafnium oxide, aluminum oxide, zirconium oxide, tantalum oxide, or the like. The charge storage layer may include an area in which electrons passing through the tunneling dielectric layer from the channel layer 164 may be stored, and may include silicon nitride, boron nitride, silicon boron nitride, or polysilicon doped with impurities. The blocking dielectric layer may include silicon oxide, silicon nitride, or a metal oxide having a greater dielectric permittivity than silicon oxide.

In a single block, the uppermost gate electrode 130 may be divided, on a plane, into two portions with respect to a string separation insulating layer (not shown). The two portions may constitute the string select line SSL described above with reference to FIG. 2.

The gate stack GS may extend in the connection region CON and may include the pad portion PAD. In the connection region CON, the farther the plurality of gate electrodes are from the upper surface of the base structure 110, the less the plurality of gate electrodes 130 extend in a first horizontal direction (the X direction), i.e. into the connection region CON. The pad portion PAD may refer to portions of the gate electrode 130 that are arranged in a staircase shape. A cover insulating layer 120 may be arranged on the pad portion PAD. A contact structure CNT connected to the gate electrode 130 through the cover insulating layer 120 may be arranged in the connection region CON.

The contact structure CNT connected to the pad portion PAD of the gate electrode 130 through the cover insulating layer 120 may be arranged in the connection region CON. The contact structure CNT may have a tapered pillar shape of which a width decreases in the third direction (the Z direction) from an upper end thereof to a lower end thereof.

Although not shown, a plurality of dummy channel structures (not shown) extending in a vertical direction (the Z direction) through the gate stack GS from the upper surface of the base structure 110 may be further formed in the connection region CON. The dummy channel structure may be formed to prevent leaning or bending of the gate stack GS in the manufacturing process of the integrated circuit device 100 and ensure structural stability. The plurality of dummy channel structures may have a similar structure and shape to a structure and shape of the plurality of channel structures 160.

A first upper insulating layer 170 may be arranged on the gate stack GS and the cover insulating layer 120. For example, the first upper insulating layer 170 may include silicon oxide or silicon oxynitride.

The first upper insulating layer 170 may include a key opening 172 at a position vertically overlapping an area in which the plurality of alignment keys 161 of the plurality of channel structures 160 are arranged. The key opening 172 may be formed directly on the recessed portion of the uppermost insulating layer 140 of the gate stack GS. The key opening 172 may penetrate through the first upper insulating layer 170 in a vertical direction. The key opening 172 may generally have a tapered shape of which a width increases in a direction away from the base structure 110.

A sidewall 174, which defines the key opening 172 of the first upper insulating layer 170, may include an inclined surface. For example, the sidewall 174 defining the key opening 172 of the first upper insulating layer 170 may include an inclined surface inclined at an angle with respect to the third direction (the Z direction) perpendicular to the upper surface of the base structure 110.

The sidewall 174 defining the key opening 172 of the first upper insulating layer 170 may include a step 173. The step 173 may continuously extend along the circumference of the key opening 172 in a plan view. Because the sidewall 174 of the first upper insulating layer 170 includes the step 173, the sidewall 174 of the first upper insulating layer 170 may include at least two segments extending in different directions from each other. For example, when the sidewall 174 of the first upper insulating layer 170 includes two segments connected to each other between a lower end and an upper end of the sidewall 174, an angle between extension directions of the two segments may be in a range of about 20° to about 90°. In other words, a difference between an angle between one of the two segments of the sidewall 174 of the first upper insulating layer 170 and a reference direction (for example, a direction parallel to the main surface to the base structure 110) and an angle between the other one of the two segments and the reference direction may be in a range of about 20° to about 90°.

In example embodiments, the sidewall 174 of the first upper insulating layer 170 may include a first segment 174a, a second segment 174b, and a third segment 174c that are connected between the lower end and the upper end of the sidewall 174. In this case, an extension direction of the first segment 174a may be different from that of the second segment 174b, and the extension direction of the second segment 174b may be different from that of the third segment 174c. For example, a first inclination angle between the extension direction of the first segment 174a and the first direction (the X direction) perpendicular to the main surface of the base structure 110 may be greater than a second inclination angle between the extension direction of the second segment 174b and the first direction (the X direction) parallel to the main surface of the base structure 110, and the second inclination angle of the second segment 174b may be less than a third inclination angle between the extension direction of the third segment 174c and the first direction (the X direction) parallel to the main surface of the base structure 110.

In example embodiments, a distance in a horizontal direction (the X direction or the Y direction) between the lower end and the upper end of the sidewall 174 of the first upper insulating layer 170 may be in a range of about 0.1 μm to about 10 μm.

In example embodiments, the first upper insulating layer 170 may include a first sub-insulating layer and a second sub-insulating layer, which are sequentially stacked on the gate stack GS. The first sub-insulating layer may include a material different from a material of the second sub-insulating layer. For example, the first sub-insulating layer may include silicon nitride, and the second sub-insulating layer may include silicon oxide.

For example, in order to form the first upper insulating layer 170, a process of coating an insulating material layer on the gate stack GS and a process of forming the key opening 172 may be sequentially performed. The process of forming the key opening 172 may include a primary etching process and a secondary etching process that are sequentially performed on the insulating material layer. In this case, a width of a mask opening of a mask pattern used in the secondary etching process may be greater than a width of an opening of a mask pattern used in the primary etching process. Thus, the sidewall 174 of the first upper insulating layer 170 may undergo the primary etching process and the secondary etching process, resulting in formation of the step 173.

A second upper insulating layer 182 may be arranged on the first upper insulating layer 170. The key opening 172 of the first upper insulating layer 170 may be filled with the second upper insulating layer 182. The key opening 172 may be at least partially filled with the second upper insulating layer 182 such that the second upper insulating layer 182 may cover or overlap the plurality of alignment keys 161 of the plurality of channel structures 160. The second upper insulating layer 182 may include silicon oxide or silicon oxynitride.

The key opening 172 of the first upper insulating layer 170 is at least partially filled with the second upper insulating layer 182, and a recessed portion 182R may be formed at an upper side of the second upper insulating layer 182. The recessed portion 182R of the second upper insulating layer 182 may be a portion recessed from a peripheral portion thereof. In a plan view, the recessed portion 182R of the second upper insulating layer 182 may have a size that overlaps an area in which the plurality of alignment keys 161 of the plurality of channel structures 160 are arranged. In the key opening 172 of the first upper insulating layer 170, the second upper insulating layer 182 is formed along a curve that is formed by protrusions of the plurality of alignment keys 161 of the plurality of channel structures 160 from the uppermost insulating layer 140, and thus, the recessed portion 182R of the second upper insulating layer 182 may provide an uneven surface.

A top supporting layer TS may be arranged on the second upper insulating layer 182. The top supporting layer TS provides structural stability to the gate stack GS during a manufacturing process of the integrated circuit device 100, thereby preventing a process failure due to bending or leaning of the gate stack GS. The top supporting layer TS may include silicon oxide or silicon oxynitride.

A plurality of holes TSH may be formed in top supporting layer TS. The plurality of holes TSH may vertically overlap the word line cut opening WLH. The plurality of holes TSH may be at least partially filled with an upper buried layer 184. In some embodiments, the upper buried layer 184 may include the same material as a material of the word line cut 150. The upper buried layer 184 may include silicon oxide or silicon oxynitride.

A buried insulating pattern 190 may be arranged between the second upper insulating layer 182 and an upper support layer such as top supporting layer TS. The recessed portion 182R of the second upper insulating layer 182 may be filled with the buried insulating pattern 190. The buried insulating pattern 190 may be between the second upper insulating layer 182 and the top supporting layer TS and surrounded by the second upper insulating layer 182 in a plan view. The buried insulating pattern 190 may overlap the plurality of alignment keys 161 of the plurality of channel structures 160 in a vertical direction (the Z direction). For example, in a plan view, the buried insulating pattern 190 may have a planar area that overlaps all of the plurality of alignment keys 161 of the plurality of channel structures 160.

The buried insulating pattern 190 may include an upper surface 192U, a lower surface 192L, and a side surface 192S. The upper surface 192U of the buried insulating pattern 190 may contact a lower surface of the top supporting layer TS, and the lower surface 192L of the buried insulating pattern 190 may face the plurality of channel structures 160. The side surface 192S of the buried insulating pattern 190 may extend between the lower surface 192L and the upper surface 192U of the buried insulating pattern 190. The side surface 192S of the buried insulating pattern 190 may be surrounded by and in contact with the second upper insulating layer 182.

The upper surface 192U of the buried insulating pattern 190 may be flat. In example embodiments, the buried insulating pattern 190 and the second upper insulating layer 182 may have a flat surface through the same planarization process. By the planarization process, the upper surface 192U of the buried insulating pattern 190 may be coplanar with an upper surface of the second upper insulating layer 182.

In addition, because the buried insulating pattern 190 is at least partially filled into the recessed portion 182R of the second upper insulating layer 182, the lower surface 192L and the side surface 192S of the buried insulating pattern 190 may have shapes corresponding to that of a surface provided by the recessed portion 182R of the second upper insulating layer 182.

The lower surface 192L of the buried insulating pattern 190 may have an uneven shape. As described above, the recessed portion 182R of the second upper insulating layer 182 provides an uneven surface corresponding to a curve formed by protrusions of the plurality of alignment keys 161 of the plurality of channel structures 160 from the insulating layer 140 at the uppermost portion of the gate stack GS, and thus, the lower surface 192L of the buried insulating pattern 190 at least partially filled into the recessed portion 182R of the second upper insulating layer 182 may have an uneven shape.

The side surface 192S of the buried insulating pattern 190 may extend with an inclination from the lower surface 192L of the buried insulating pattern 190 to the upper surface 192U. The side surface 192S of the buried insulating pattern 190 may extend outwardly with an inclination from the lower end to the upper end.

For example, the buried insulating pattern 190 may include different materials from that of each of the first upper insulating layer 170 and the second upper insulating layer 182. For example, the buried insulating pattern 190 may include polysilicon.

A bit line contact BLC may contact the conductive plug 168 of the channel structure 160 via the top supporting layer TS and the second upper insulating layer 182. The bit line BL contacting the bit line contact BLC may extend in the second direction (the Y direction) on the top supporting layer TS. The bit line contact BLC may electrically connect the bit line BL and the channel structure 160 to each other. In example embodiments, the plurality of bit line contact BLC may be connected to the plurality of channel structures 160 via the buried insulating pattern 190 sandwiched between the top supporting layer TS and the second upper insulating layer 182.

In addition, in the connection region CON, a plurality of conductive lines ML may be arranged on the top supporting layer TS. The contact structure CNT may penetrate the top supporting layer TS, the first upper insulating layer 170, the second upper insulating layer 182, and the cover insulating layer 120. The contact structure CNT may electrically connect the conductive line ML to the gate electrode 130.

Figure 6:
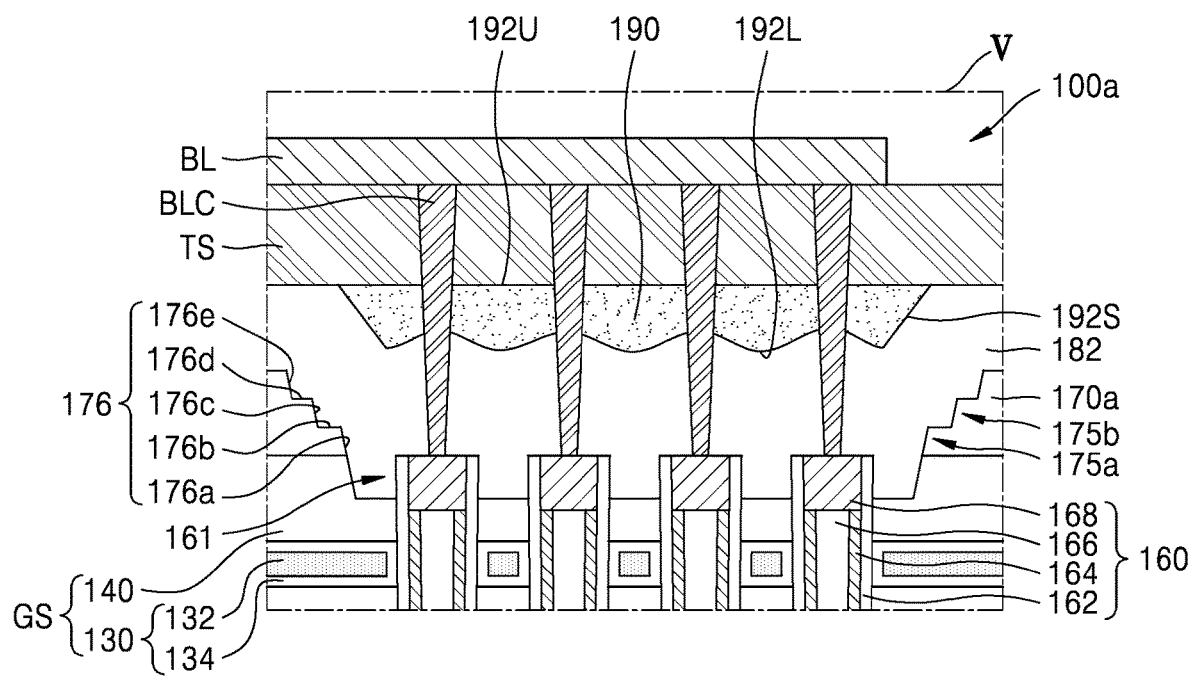
FIG. 6 is a cross-sectional view of a portion of an integrated circuit device according to example embodiments of the inventive concept.

FIG. 6 is a cross-sectional view of a portion of an integrated circuit device 100a according to example embodiments of the inventive concept. FIG. 6 shows a portion corresponding to an area "V" in FIG. 4.

Referring to FIG. 6, a sidewall 176, which defines the key opening 172 (see FIG. 4) of a first upper insulating layer 170a, may include a first step 175a and a second step 175b between a lower end and upper end thereof. The second step 175b may be arranged between the first step 175a and the upper end of the sidewall 176 of the first upper insulating layer 170a. Each of the first step 175a and the second step 175b may continuously extend along the circumference or edge of the key opening. The first step 175a of the sidewall 176 of the first upper insulating layer 170a may be defined by two segments extending in different directions, and the second step 175b of the sidewall 176 of the first upper insulating layer 170a may be defined by two segments extending in different directions.

For example, the sidewall 176 of the first upper insulating layer 170a may include a first segment 176a, a second segment 176b, a third segment 176c, a fourth segment 176d, and a fifth segment 176e, which are sequentially connected between the lower end and the upper end of the sidewall 176. Two segments adjacent to each other from among the first through fifth segments 176a to 176e may extend in different directions from each other. For example, extension directions of the first segment 176a and the second segment 176b may be different from each other, extension directions of the second segment 176b and the third segment 176c may be different from each other, extension directions of the third segment 176c and the fourth segment 176d may be different from each other, and extension directions of the fourth segment 176d and the fifth segment 176e may be different from each other. For example, an angle between the extension directions of two adjacent segments among the first through fifth segments 176a to 176e may be in a range of about 20° to about 90°.

For example, in order to form the first upper insulating layer 170a, a process of coating an insulating material layer on the gate stack GS and a process of forming a key opening may be sequentially performed. The process of forming a key opening may include a primary etching process, a secondary etching process, and a third etching process sequentially performed on the insulating material layer. In this case, a width of a mask opening of a mask pattern used in the secondary etching process may be greater than a width of an opening of a mask pattern used in the primary etching process, and a width of a mask opening of a mask pattern used in the third etching process may be greater than the width of the opening of the mask pattern used in the secondary etching process and the primary etching process. Thus, the sidewall 176 of the first upper insulating layer 170a may be formed to have the first step 175a and the second step 175b through the primary etching process, the secondary etching process, and the third etching process.

Figure 7:
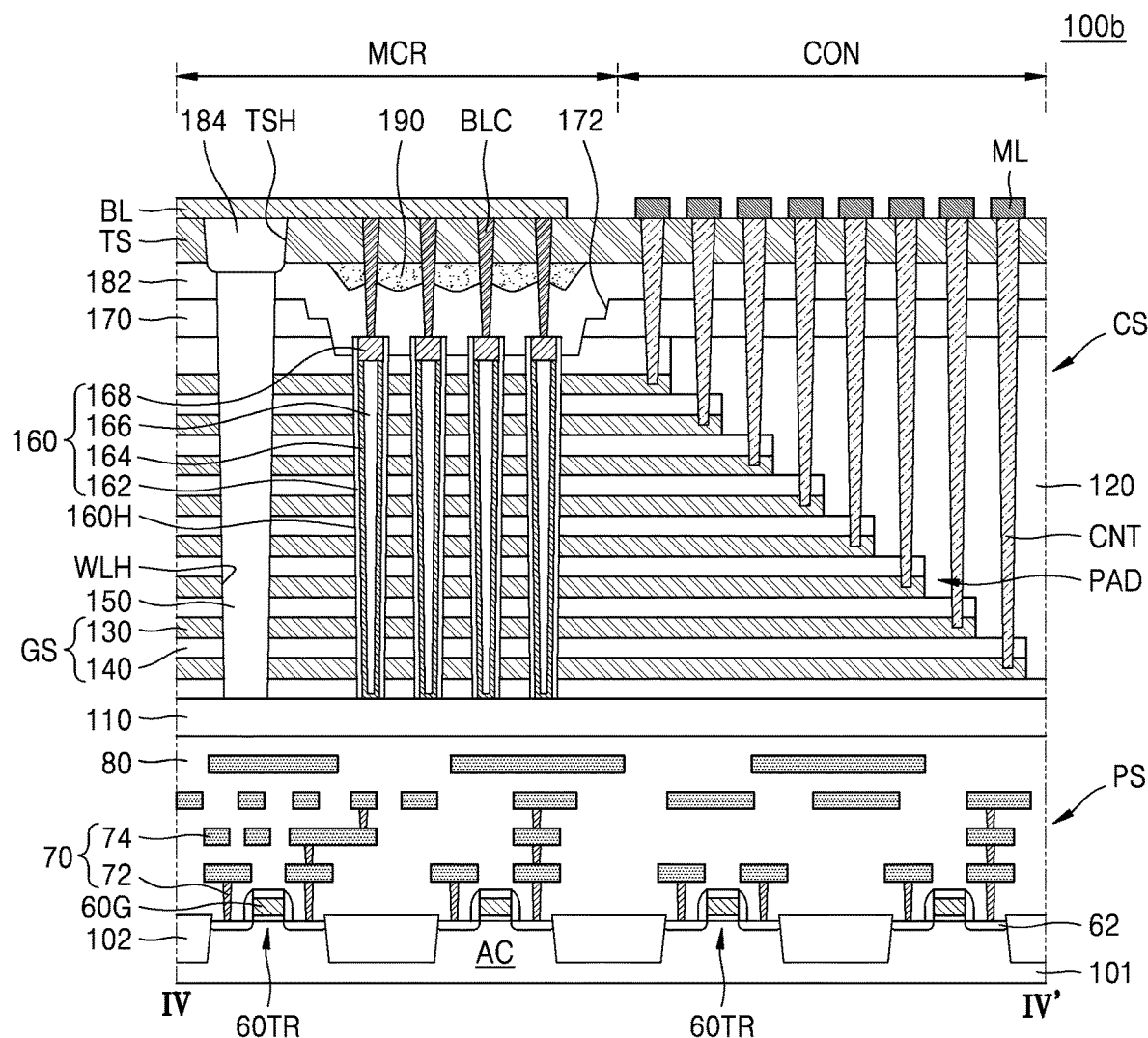
FIG. 7 is a cross-sectional view of an integrated circuit device according to example embodiments of the inventive concept.

FIG. 7 is a cross-sectional view illustrating an integrated circuit device 100b according to example embodiments of the inventive concept.

The integrated circuit device 100b shown in FIG. 7 may be substantially similar to the integrated circuit device 100 described with reference to FIGS. 3 to 5 in that the integrated circuit device 100b includes a peripheral circuit structure PS. Below, differences between the integrated circuit device 100b in FIG. 7 and the integrated circuit device 100 in FIGS. 3 to 5 will be mainly described.

Referring to FIG. 7, the integrated circuit device 100b may include a peripheral circuit structure PS and a cell array structure CS arranged at a vertically higher level than the peripheral circuit structure PS. The cell array structure CS may include a memory cell region MCR and a connection region CON, and the peripheral circuit structure PS may include a peripheral circuit region.

The integrated circuit device 100b of the present embodiment may have a cell on periphery (COP) structure in which the cell array structure CS is arranged on the peripheral circuit structure PS. A base structure 110 may be arranged between the peripheral circuit structure PS and the cell array structure CS.

The peripheral circuit structure PS may include a peripheral circuit transistor 60TR arranged on a semiconductor substrate 101, and a peripheral circuit line 70. In the semiconductor substrate 101, an active area AC may be defined by a device separator 102, and a plurality of peripheral circuit transistors 60TR may be formed in the active area AC. The plurality of peripheral circuit transistors 60TR may include a peripheral circuit gate 60G, and source/drain areas 62 arranged at portions of the semiconductor substrate 101 at opposite sides of the peripheral circuit transistor 60TR.

The peripheral circuit line 70 may include a plurality of peripheral circuit contacts 72 and a plurality of peripheral circuit metal layers 74. The peripheral circuit transistor 60TR and an interlayer insulating layer 80 covering or overlapping the peripheral circuit transistor 60TR may be arranged on the semiconductor substrate 101. The plurality of peripheral circuit metal layers 74 may have a multilayer structure of a plurality of metal layers arranged at different vertical levels from each other.

Figure 8A:
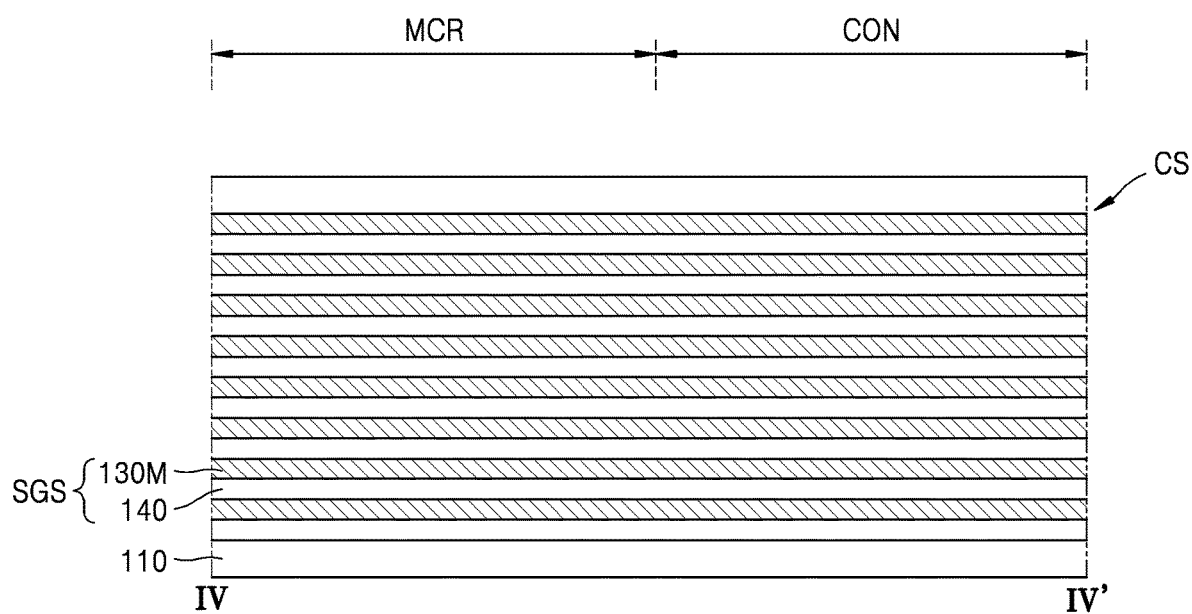
FIGS. 8A to 8O are cross-sectional views illustrating a method of manufacturing an integrated circuit device, according to example embodiments of the inventive concept.

FIGS. 8A to 8O are cross-sectional views illustrating a method of manufacturing an integrated circuit device 100, according to example embodiments of the inventive concept. A method of manufacturing the integrated circuit device 100 described with reference to FIGS. 3 to 5 will be described below, with reference to FIGS. 8A to 8O.

Referring to FIG. 8A, the plurality of insulating layers 140 and a plurality of mold layers 130M may be alternately formed on the main surface of the base structure 110, thereby forming a sacrifice gate stack SGS. In example embodiments, the plurality of insulating layers 140 may include an insulating material, such as silicon oxide, silicon oxynitride, or the like. The plurality of mold layers 130M may include a material different from a material of the plurality of insulating layers 140, and the plurality of mold layers 130M may include silicon nitride, silicon oxynitride, or polysilicon doped with impurities.

Figure 8B:
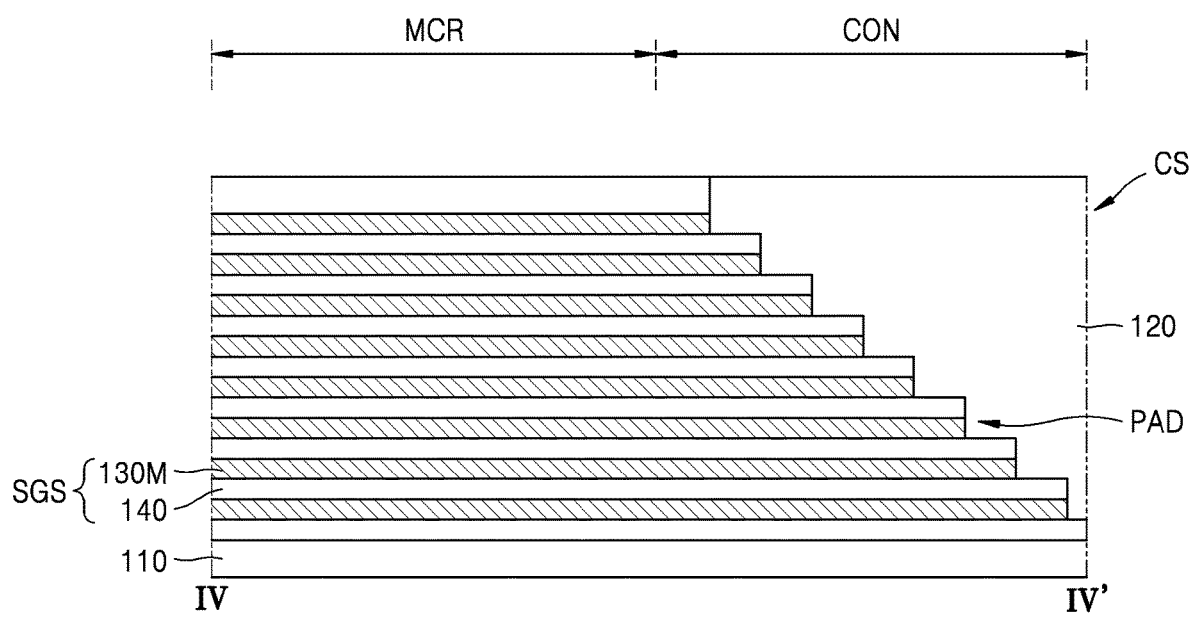

Referring to FIG. 8B, the pad portion PAD may be formed by sequentially patterning the sacrifice gate stack SGS in the connection region CON. In example embodiments, the pad portion PAD may have a staircase shape that has upper surfaces of different levels with respect to the base structure 110.

Then, the cover insulating layer 120 covering or overlapping the pad portion PAD may be formed. The cover insulating layer 120 may include an insulating material, such as silicon oxide, silicon oxynitride, or the like.

Figure 8C:
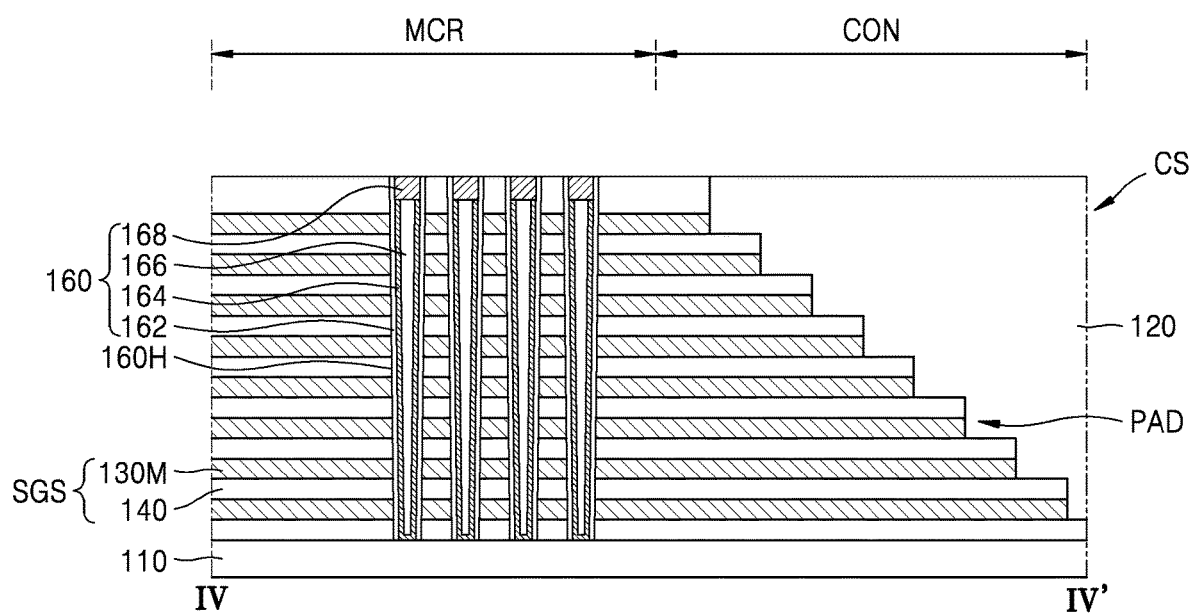

Referring to FIG. 8C, the sacrifice gate stack SGS may be patterned to form the channel hole 160H, and a channel structure 160 including the gate insulating layer 162, the channel layer 164, the buried insulating layer 166, and the conductive plug 168 may be formed on the inner wall of the channel hole 160H.

Figure 8D:
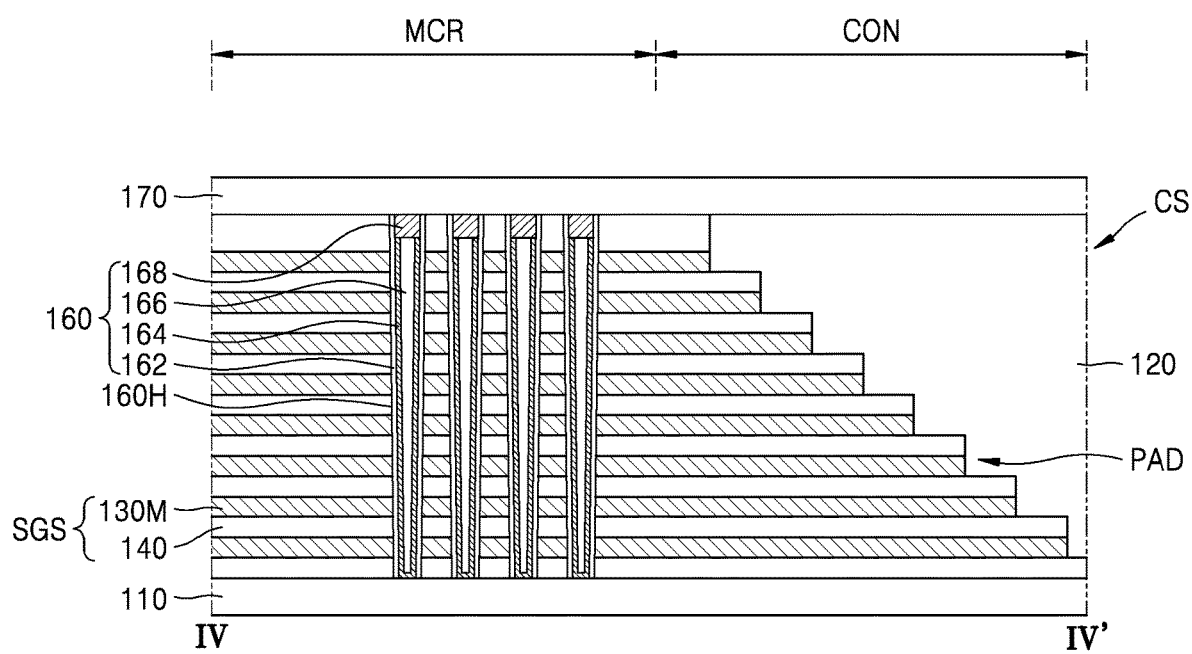

Referring to FIG. 8D, the first upper insulating layer 170 may be formed on the sacrifice gate stack SGS and the cover insulating layer 120. The first upper insulating layer 170 may include silicon oxide or silicon oxynitride.

Figure 8E:
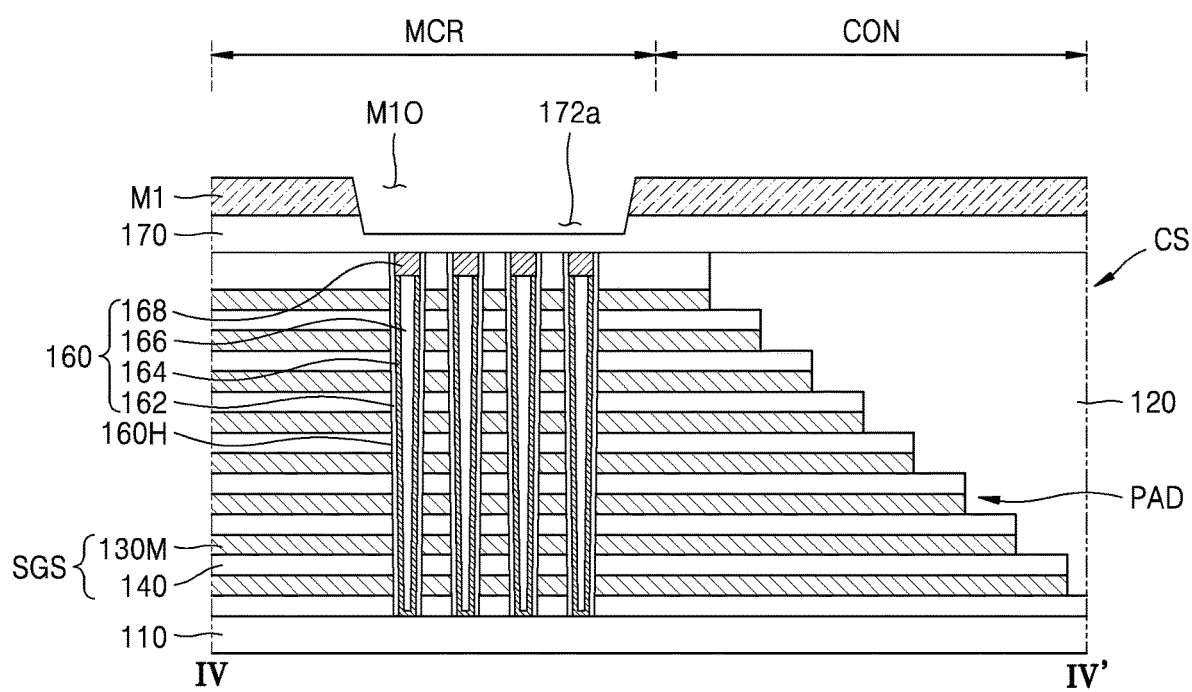

Referring to FIG. 8E, a first mask pattern M1 may be formed on the first upper insulating layer 170. The first mask pattern M1 may include a first mask opening M1O. After the first mask pattern M1 is formed, a primary etching process may be performed using the first mask pattern M1 as an etching mask. By the primary etching process, a portion of the first upper insulating layer 170 is removed, thereby forming an upper opening 172a in the first upper insulating layer 170.

Figure 8F:
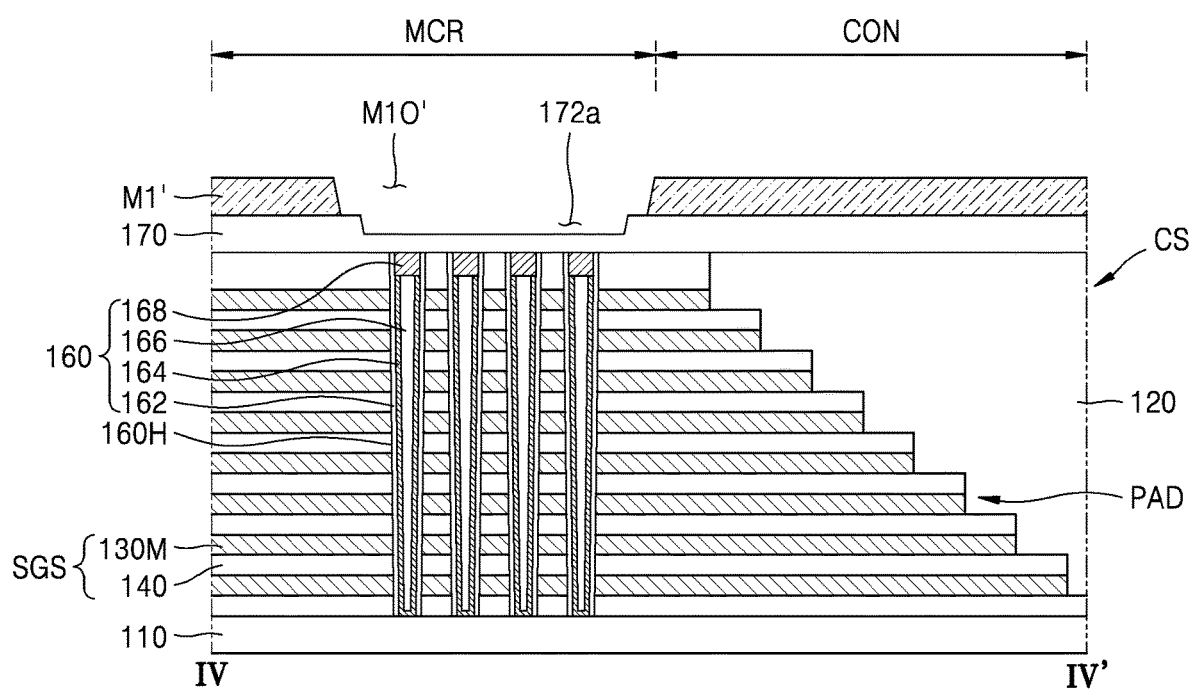

Referring to FIGS. 8E and 8F, a trimming process of the first mask pattern M1 may be performed. A first mask pattern M1' that is trimmed may have a second mask opening M1O'. A width of the second mask opening M1O' may be greater than a width of the first mask opening M1O. Because the width of the second mask opening M1O' is greater than the width of the first mask opening M1O, an upper surface of the first upper insulating layer 170 around the upper opening 172a may be exposed.

Figure 8G:
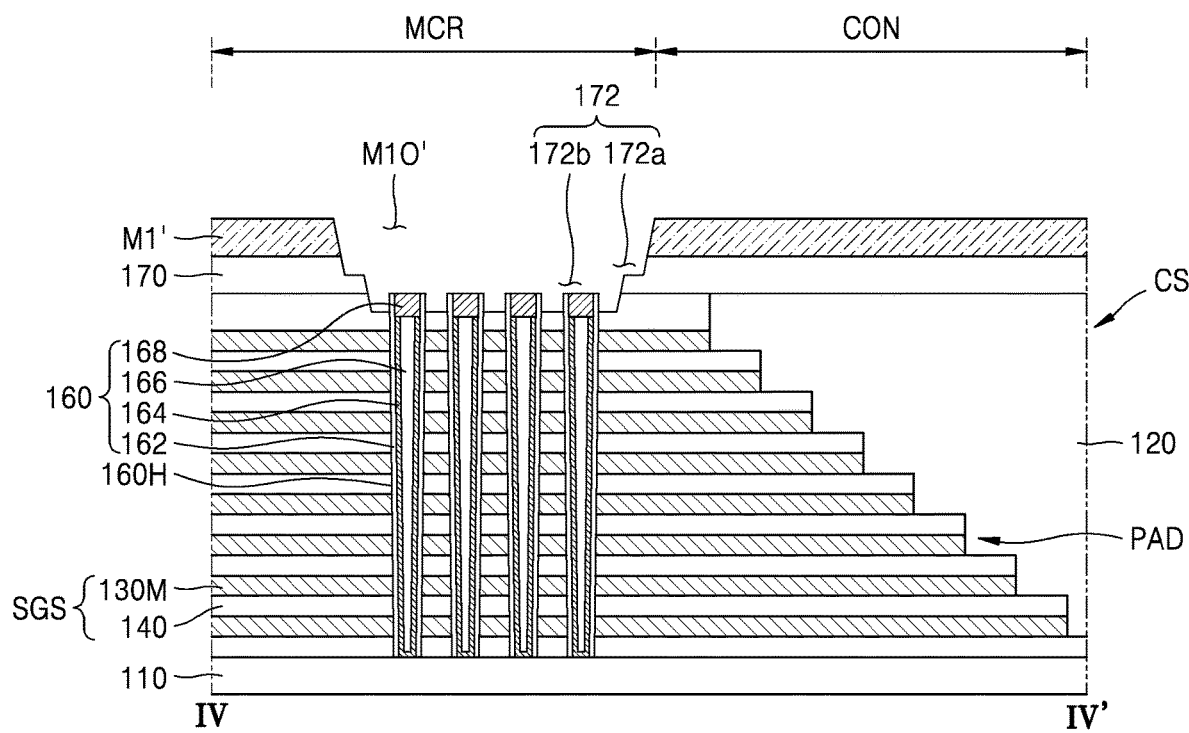

Referring to FIG. 8G, a secondary etching process may be performed using the trimmed first mask pattern M1' as an etching mask. For example, the secondary etching process may include a wet etching process. By the secondary etching process, a lower opening 172b connecting with the upper opening 172a may be formed. The upper opening 172a and the lower opening 172b may be part of the key opening 172. By the secondary etching process, a portion of the first upper insulating layer 170 may be removed, and a portion of the insulating layer 140 at the uppermost portion of the sacrifice gate stack SGS may be removed. The secondary etching process may be performed so that a portion of each of the plurality of channel structures 160 protrudes at a certain height from the sacrifice gate stack SGS.

As described with reference to FIGS. 8E to 8G, the width of the second mask opening M1O' of the trimmed first mask pattern M1' used in the secondary etching process is greater than the width of the first mask opening M1O of the first mask pattern M1 used in the primary etching process, and thus, a sidewall of the first upper insulating layer 170 formed through the primary etching process and the secondary etching process may have a step.

Figure 8H:
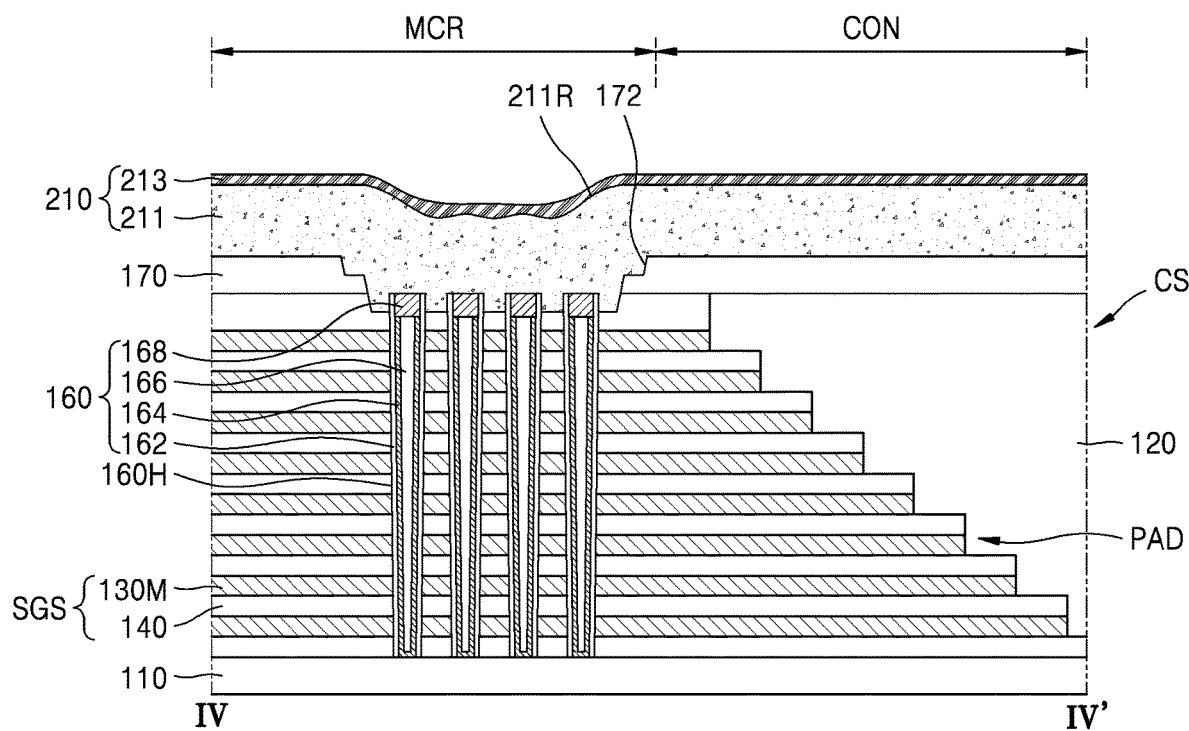

Referring to FIG. 8H, a lower mask layer 211 is formed on a resultant structure of FIG. 8G. The lower mask layer 211 is a hard mask and may include, for example, an amorphous carbon layer. The lower mask layer 211 may cover or overlap the first upper insulating layer 170 and at least partially fill the key opening 172 in the first upper insulating layer 170. The key opening 172 of the first upper insulating layer 170 is at least partially filled with the lower mask layer 211, but a recessed portion 211R may be formed at an upper side of the lower mask layer 211.

After the lower mask layer 211 is formed, an upper mask layer 213 is formed on the lower mask layer 211. The upper mask layer 213 may include a photoresist. The lower mask layer 211 and the upper mask layer 213 may be part of a mask layer 210.

When the upper mask layer 213 is coated along a surface of the lower mask layer 211, there is a concern that a coating defect issue may occur in the upper mask layer 213 as the slope of a sidewall provided by the recessed portion 211R of the lower mask layer 211 increases. However, in embodiments of the inventive concept, as described with reference to FIGS. 8E to 8G, a sidewall of the first upper insulating layer 170 defining the key opening 172 through the two etching processes may have a gentle slope. For example, a sidewall of the first upper insulating layer 170 formed by two etching processes has a gentle slope compared with a case where an opening exposing the plurality of channel structures 160 is formed in the first upper insulating layer 170 through a single etching process. A sidewall of the lower mask layer 211 also has a gentle slope, thus removing a coating defect issue of the upper mask layer 213.

Figure 8I:
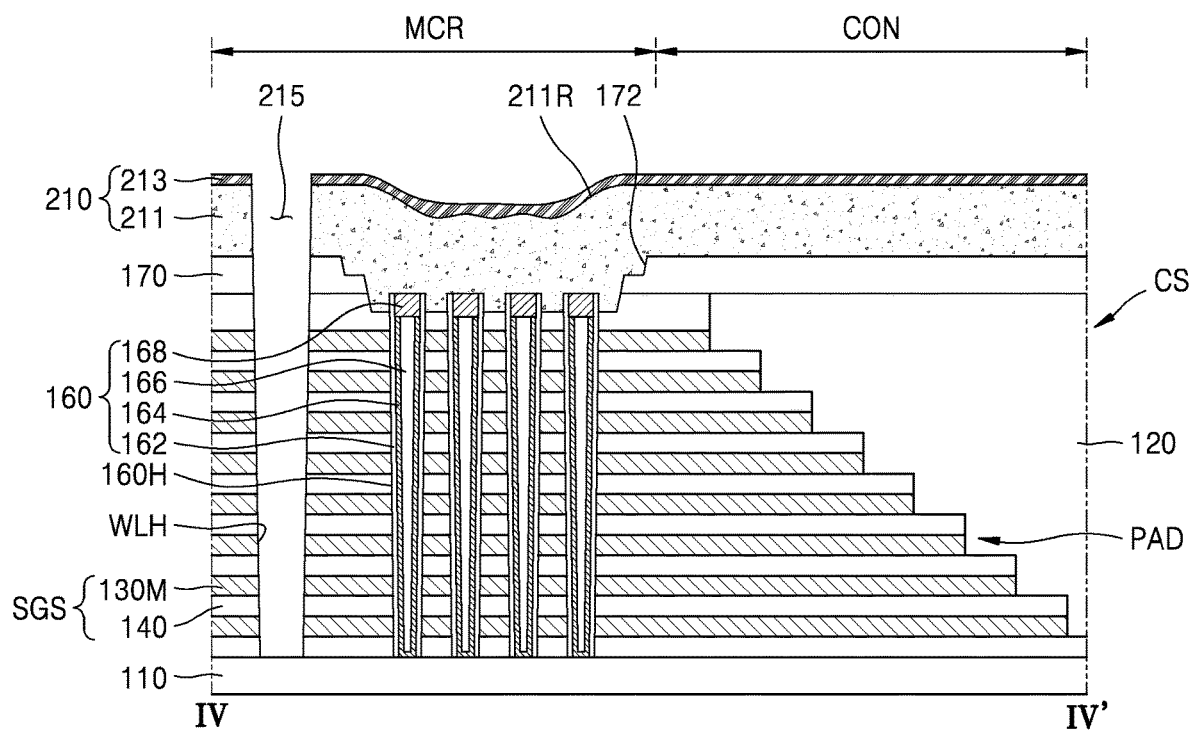

Referring to FIG. 8I, a mask opening 215 is formed through a patterning process of the mask layer 210. For example, the upper mask layer 213 is patterned to form an upper opening, and a lower opening of the lower mask layer 211 may be formed by using the upper mask layer 213 having the upper opening formed therein, as an etching mask. The upper opening in the upper mask layer 213 and the lower opening in the lower mask layer 211 may constitute the mask opening 215 in the mask layer 210. When a patterning process is performed to form the mask opening 215 in the mask layer 210, an alignment key of the plurality of channel structures 160 may be used as an alignment structure for a photolithography process.

After the mask opening 215 is formed in the mask layer 210, a portion of the sacrifice gate stack SGS may be removed to form the word line cut opening WLH. The word line cut opening WLH may be formed through an etching process in which the mask layer 210 is used as an etching mask.

Figure 8J:
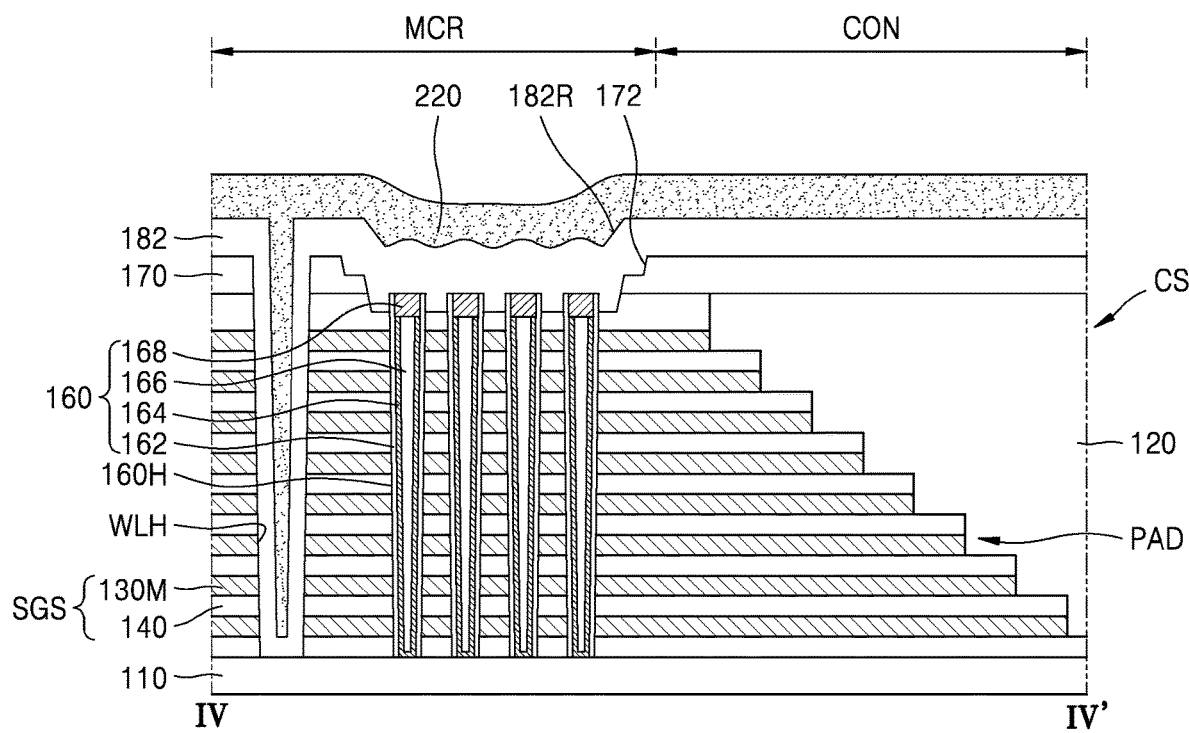

Referring to FIG. 8J, the mask layer 210 is removed from the product of FIG. 8I, and then, the second upper insulating layer 182 is formed. The second upper insulating layer 182 may be formed on the first upper insulating layer 170 and at least partially fill the key opening 172 of the first upper insulating layer 170. The recessed portion 182R may be formed at an upper portion of the second upper insulating layer 182 portion with which the key opening 172 is at least partially filled. In the key opening 172 of the first upper insulating layer 170, the second upper insulating layer 182 is formed along a curve formed by protrusions of a plurality of alignment keys of the plurality of channel structures 160 from the insulating layer 140 at the uppermost portion of the sacrifice gate stack SGS, and thus, the recessed portion 182R of the second upper insulating layer 182 may provide an uneven surface. In addition, the second upper insulating layer 182 may cover the inner wall of the word line cut opening WLH. The second upper insulating layer 182 may include silicon oxide or silicon oxynitride.

After the second upper insulating layer 182 is formed, a material layer 220 may be formed on the second upper insulating layer 182. A portion of the material layer 220 may be formed within the word line cut opening WLH, and may be formed on the second upper insulating layer 182 portion that covers the inner wall of the word line cut opening WLH. The material layer 220 may include an insulating material. For example, the material layer 220 may include polysilicon.

Figure 8K:
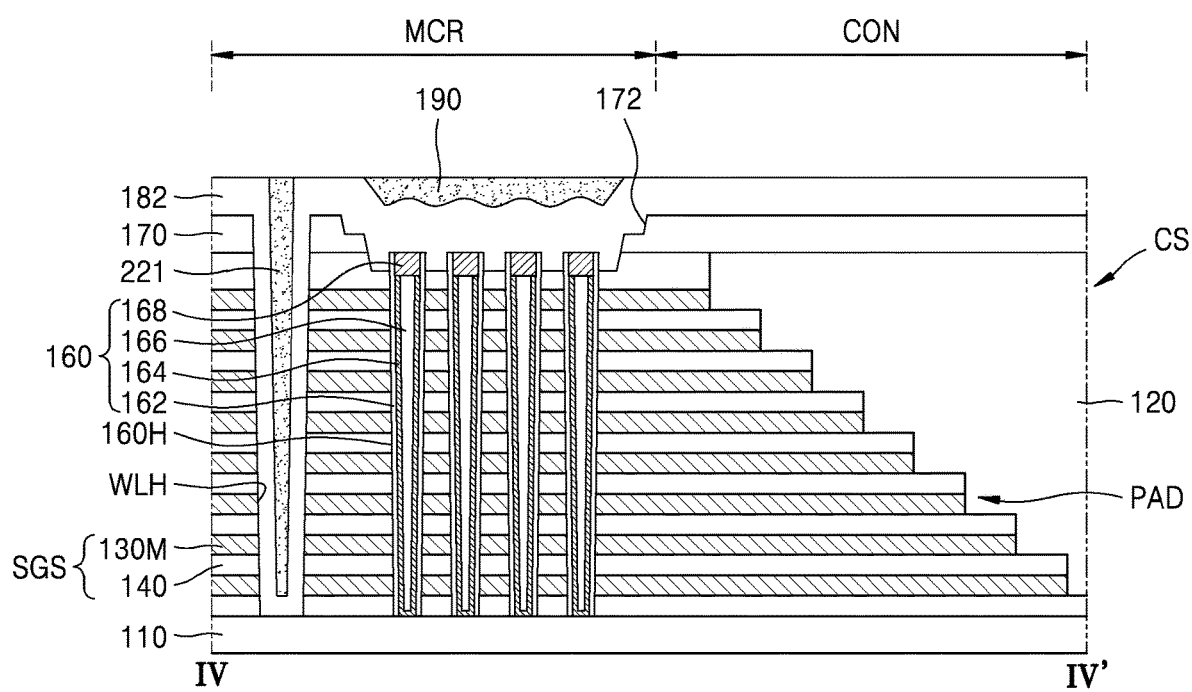

Referring to FIGS. 8J and 8K, a planarization process may be performed on the product of FIG. 8J. The planarization process may include removing a portion of the material layer 220 such that the second upper insulating layer 182 is partially exposed. Through the planarization process, a portion of the material layer 220 may form the buried insulating pattern 190 in the recessed portion 182R of the second upper insulating layer 182, and the other portion of the material layer 220 may form a sacrifice buried layer 221 in the word line cut opening WLH. By the planarization process, an exposed upper surface of the buried insulating pattern 190, an exposed surface of the second upper insulating layer 182, and an exposed surface of the sacrifice buried layer 221 may be on the same plane.

Figure 8L:
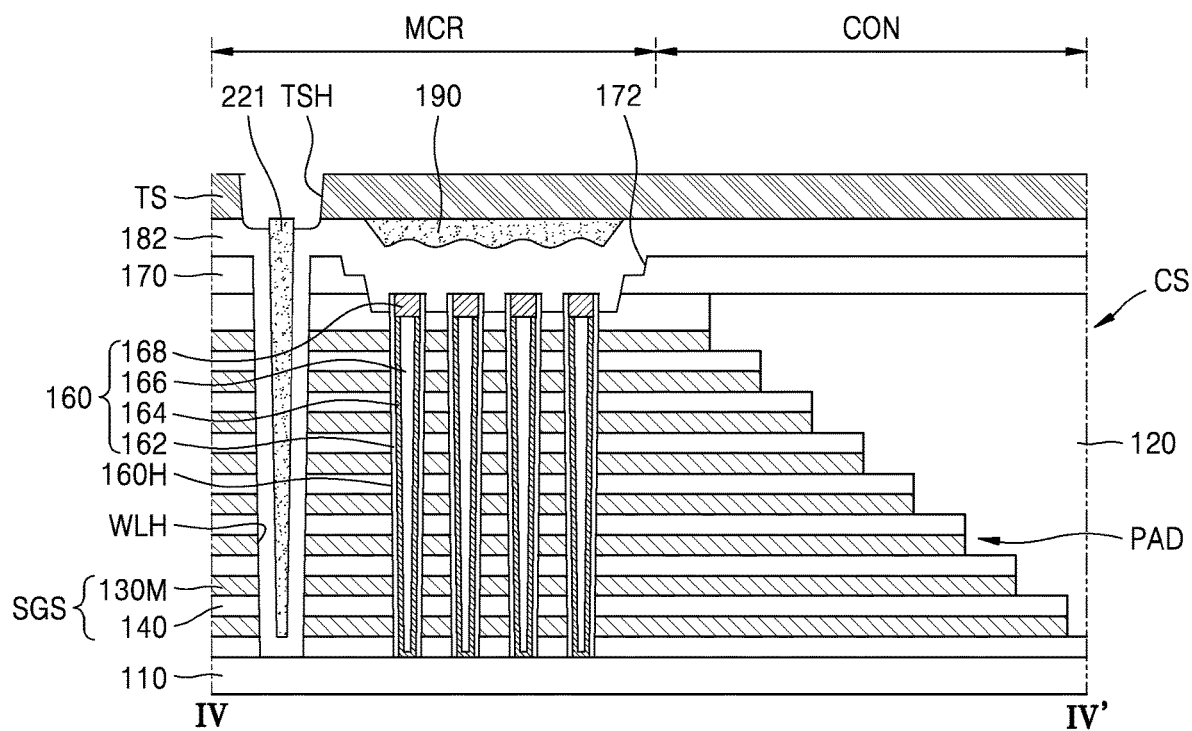

Referring to FIG. 8L, the top supporting layer TS including the plurality of holes TSH may be formed on the second upper insulating layer 182 and the buried insulating pattern 190. In a plan view, the plurality of holes TSH may vertically overlap with the word line cut opening WLH and be spaced apart from each other in a first horizontal direction (the X direction). In a process of forming the plurality of holes TSH, a portion of the second upper insulating layer 182 below the plurality of holes TSH may be removed.

Figure 8M:
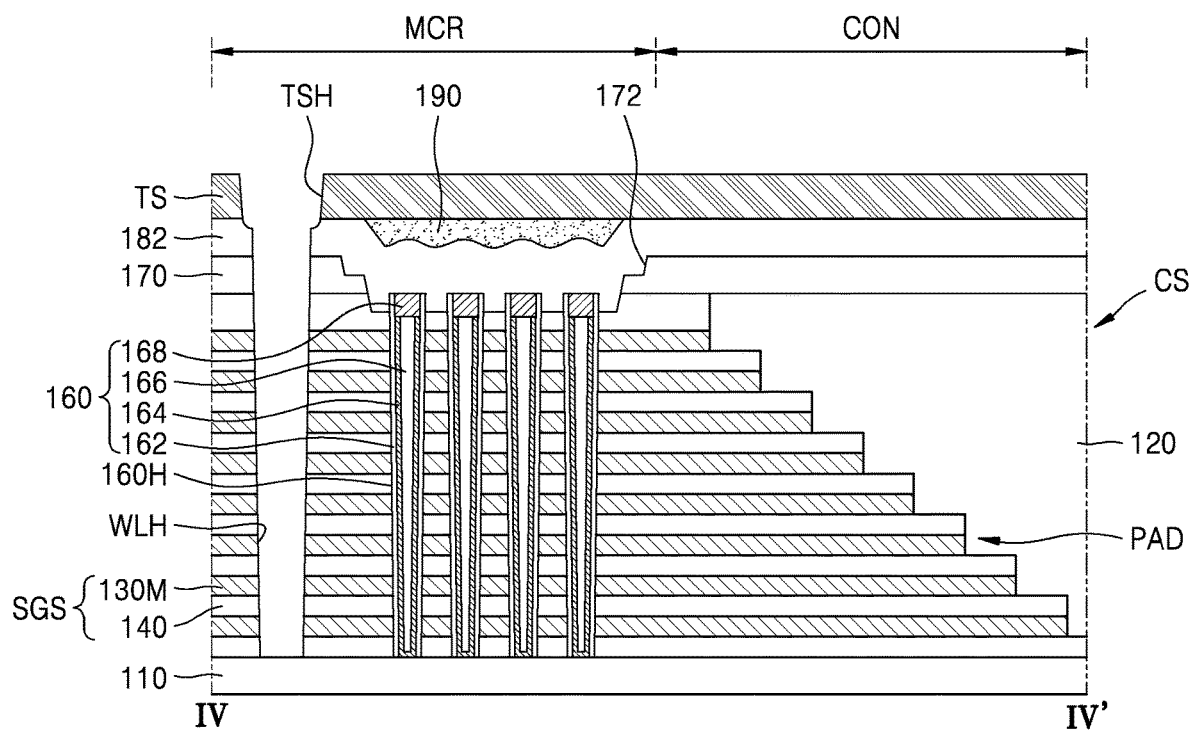

Referring to FIGS. 8L and 8M, the sacrifice buried layer 221 exposed through the plurality of holes TSH is removed, and a portion of the second upper insulating layer 182 in the word line cut opening WLH is removed. For example, in order to remove the sacrifice buried layer 221 and a portion of the second upper insulating layer 182 within the word line cut opening WLH, a plurality of wet etching processes may be performed.

Figure 8N:
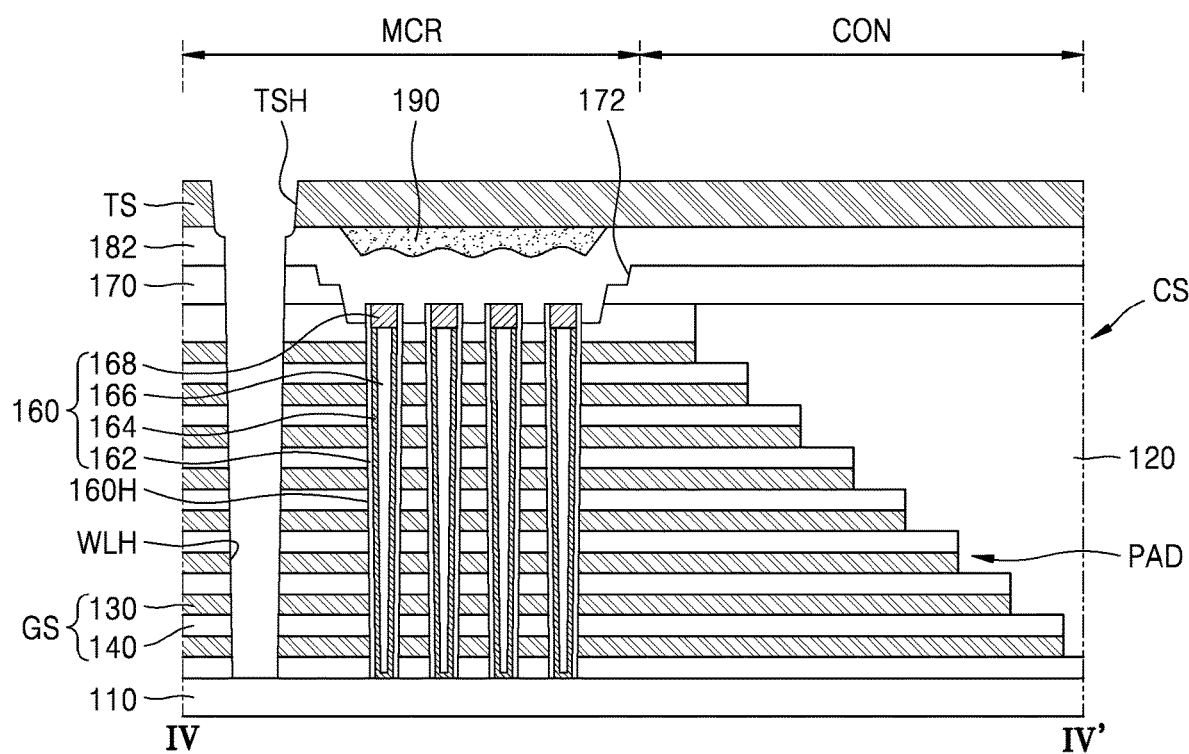
Figure 80:
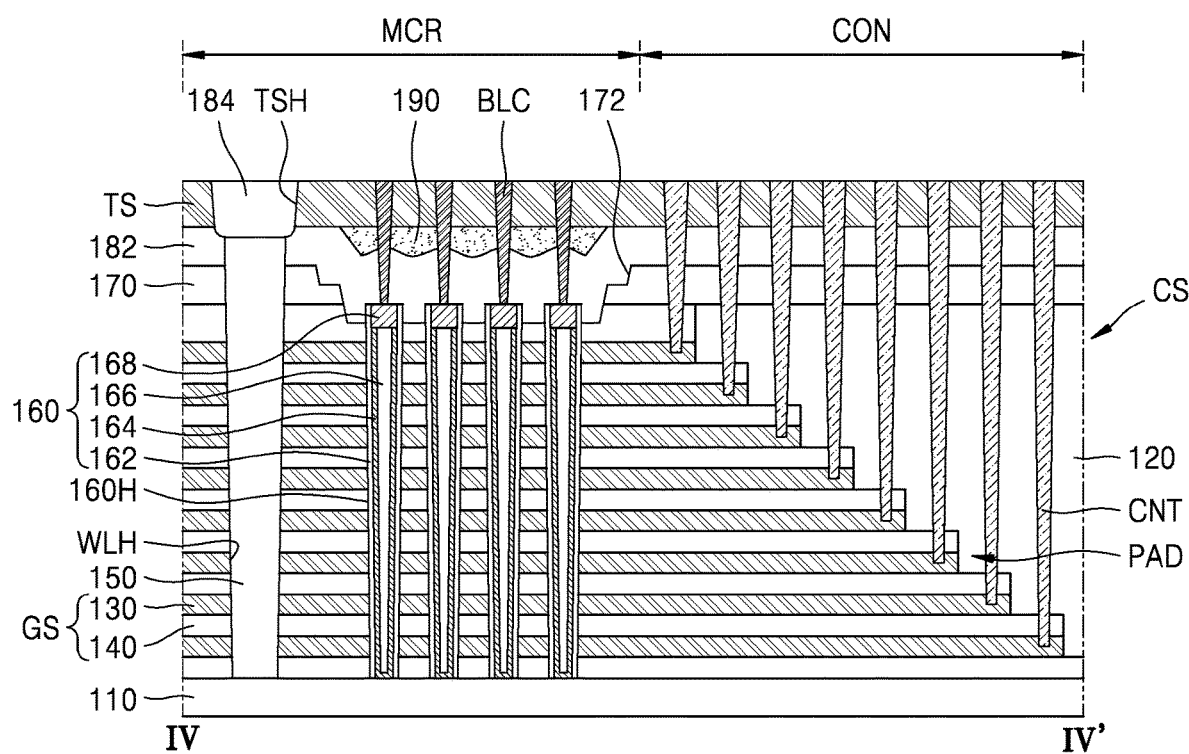

Referring to FIGS. 8M and 8N, the plurality of mold layers 130M exposed through a sidewall of the word line cut opening WLH may be removed. A removal process of the plurality of mold layers 130M may include a wet etching process in which a phosphoric acid solution is used as etchant. The plurality of gate electrodes 130 may be formed by burying a conductive material in locations from which the plurality of mold layers 130M are removed.

Referring to FIG. 8O, the word line cut 150 may be formed by at least partially filling an insulating material in the word line cut opening WLH, and the upper buried layer 184 may be formed by at least partially filling an insulating material in a hole TSH. In some embodiments, the upper buried layer 184 and the word line cut 150 may be formed through a same process, and the upper buried layer 184 may have the same material as a material of the word line cut 150.

Then, the contact structure CNT electrically connected to the pad portion PAD may be formed through the top supporting layer TS, the second upper insulating layer 182, the first upper insulating layer 170, and the cover insulating layer 120. Then, the bit line contact BLC electrically connected to the channel structure 160 through the top supporting layer TS, the second upper insulating layer 182, and the first upper insulating layer 170 may be formed.

Then, referring to FIG. 4, the bit line BL electrically connected to the bit line contact BLC may be formed on the top supporting layer TS, and the conductive line ML electrically connected to the contact structure CNT may be formed.

Figure 9:
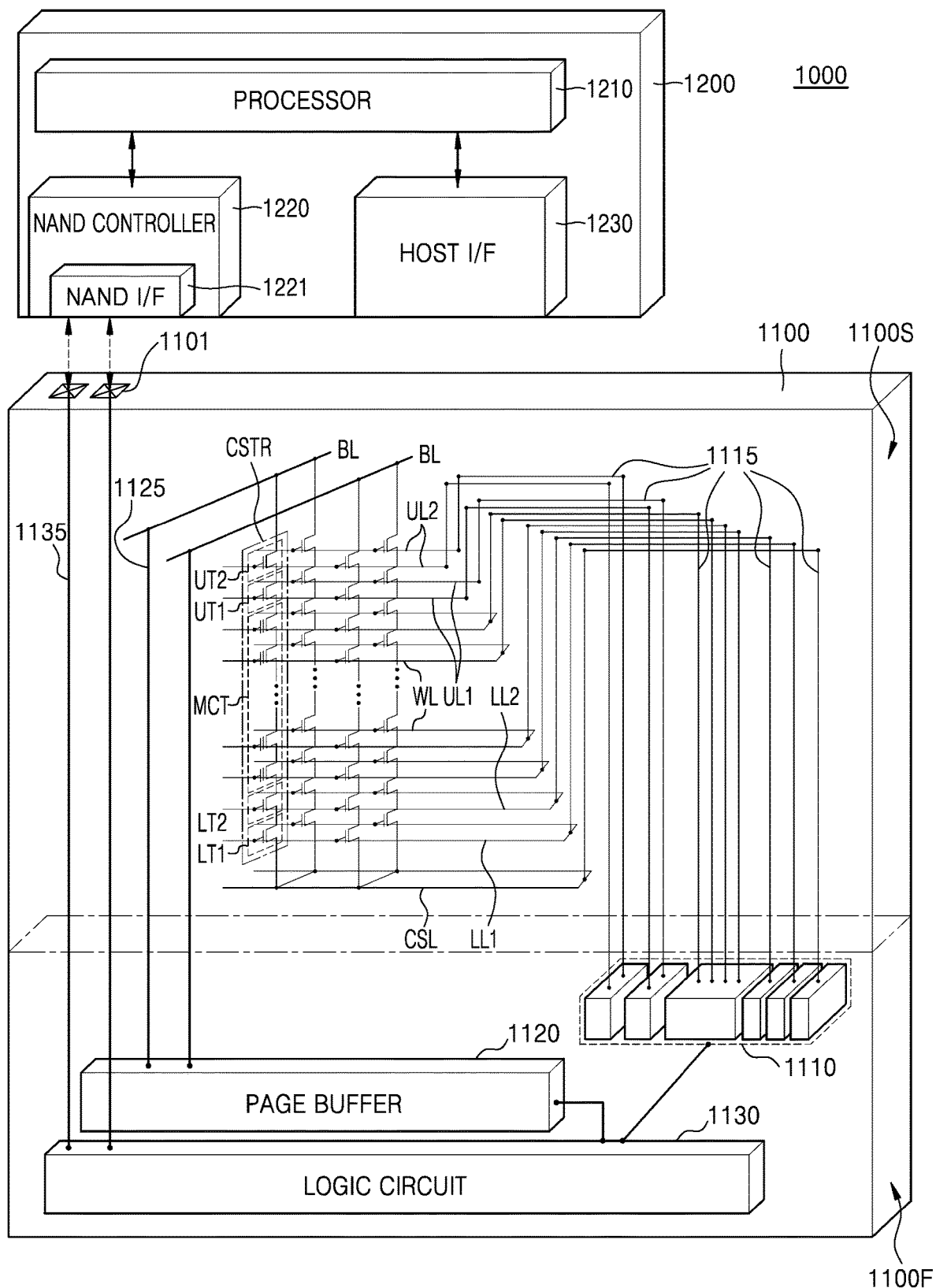
FIG. 9 is a diagram of an electronic system including an integrated circuit device according to example embodiments of the inventive concept.

FIG. 9 is a diagram illustrating an electronic system 1000 including an integrated circuit device 1100 according to example embodiments of the inventive concept.

Referring to FIG. 9, the electronic system 1000 according to the inventive concept may include the integrated circuit device 1100 and a controller 1200 electrically connected to the integrated circuit device 1100.

The electronic system 1000 may include a storage device including one or more integrated circuit devices 1100, or an electronic device including the storage device. For example, the electronic system 1000 may include a solid state drive (SSD) device, a universal serial bus (USB), a computing system, a medical device, or a communication device, which include at least one integrated circuit device 1100.

The integrated circuit device 1100 may include a non-volatile vertical memory device. For example, the integrated circuit device 1100 may include a NAND flash memory device including at least one of the integrated circuit devices 100, 100a, and 100b described above with reference to FIGS. 3 to 7. The integrated circuit device 1100 may include a first structure 1100F and a second structure 1100S on the first structure 1100F. In some embodiments, the first structure 1100F may be arranged next to the second structure 1100S.

The first structure 1100F may be a peripheral circuit structure including a decoder circuit 1110, a page buffer 1120, and a logic circuit 1130. The second structure 1100S may be a memory cell structure including a bit line BL, a common source line CSL, a plurality of word lines WL, first and second gate upper lines UL1 and UL2, first and second gate lower lines LL1 and LL2, and a plurality of memory cell strings CSTR between the bit line BL and the common source line CSL.

In the second structure 1100S, each of the plurality of memory cell strings CSTR may include lower transistors LT1 and LT2 adjacent to the common source line CSL, upper transistors UT1 and UT2 adjacent to the bit line BL, and a plurality of memory cell transistors MCT arranged between the lower transistors LT1 and LT2 and the upper transistors UT1 and UT2. The number of lower transistors LT1 and LT2 and the number of upper transistors UT1 and UT2 may be various modified according to embodiments.

In some embodiments, the upper transistors UT1 and UT2 may include a string select transistor, and the lower transistors LT1 and LT2 may include a ground select transistor. The first and second gate lower lines LL1 and LL2 may include gate electrodes of the lower transistors LT1 and LT2, respectively. The word line WL may include a gate electrode of the memory cell transistor MCT, and the first and second gate upper lines UL1 and UL2 may include gate electrodes of the upper transistors UT1 and UT2, respectively.

The common source line CSL, the first and second gate lower lines LL1 and LL2, the plurality of word lines WL, and the first and second gate upper lines UL1 and UL2 may be electrically connected to the decoder circuit 1110 through a plurality of first connection lines 1115 extending to the second structure 1100S in the first structure 1100F. The plurality of bit lines BL may be electrically connected to the page buffer 1120 through a plurality of second connection lines 1125 extending to the second structure 1100S in the first structure 1100F.

In the first structure 1100F, the decoder circuit 1110 and the page buffer 1120 may perform a control operation on at least one of the plurality of memory cell transistors MCT. The decoder circuit 1110 and the page buffer 1120 may be controlled by the logic circuit 1130.

The integrated circuit device 1100 may communicate with the controller 1200 via an input/output pad 1101 electrically connected to the logic circuit 1130. The input/output pad 1101 may be electrically connected to the logic circuit 1130 through an input/output connection line 1135 extending to the second structure 1100S in the first structure 1100F.

The controller 1200 may include a processor 1210, a NAND controller 1220, and a host interface 1230. In some embodiments, the electronic system 1000 may include a plurality of integrated circuit devices 1100, and in this case, the controller 1200 may control the plurality of integrated circuit devices 1100.

The processor 1210 may control overall operations of the electronic system 1000, including the controller 1200. The processor 1210 may be operated according to firmware and control the NAND controller 1220 to access the integrated circuit device 1100. The NAND controller 1220 may include a NAND interface 1221 for processing communication with the integrated circuit device 1100. A control command for controlling the integrated circuit device 1100, data to be recorded on the plurality of memory cell transistors MCT of the integrated circuit device 1100, data to be read from the plurality of memory cell transistors MCT of the integrated circuit device 1100, or the like may be transmitted through the NAND interface 1221. The host interface 1230 may provide a communication function between the electronic system 1000 and an external host. When a control command is received from the external host via the host interface 1230, the processor 1210 may control the integrated circuit device 1100 in response to the control command.

Figure 10:
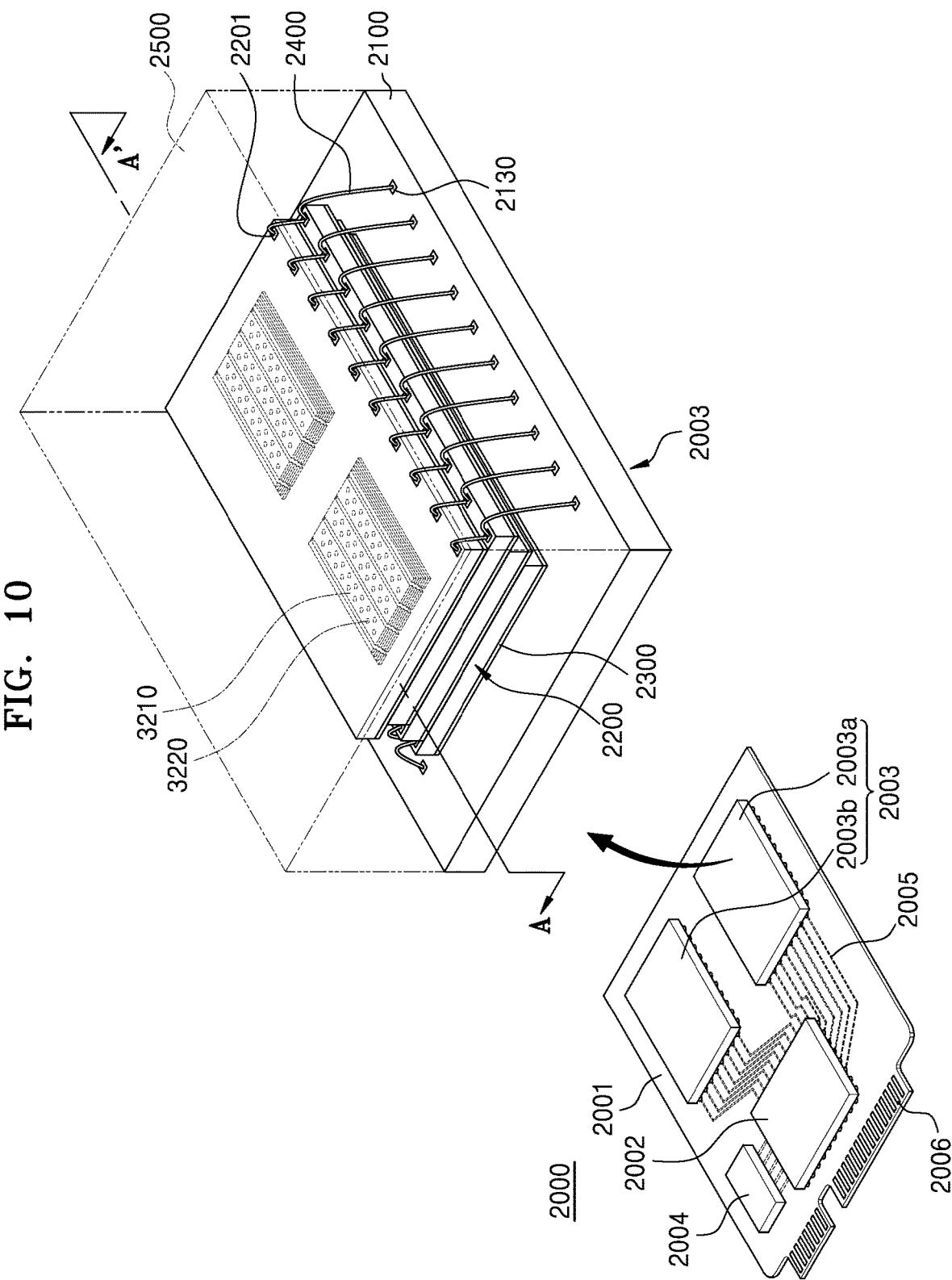
FIG. 10 is a perspective view of an electronic system including an integrated circuit device according to example embodiments of the inventive concept.

FIG. 10 is a perspective view of an electronic system 2000 including an integrated circuit device according to example embodiments of the inventive concept.

Referring to FIG. 10, the electronic system 2000 according to some embodiments of the inventive concept may include a main substrate 2001, a controller 2002 mounted on the main substrate 2001, one or more semiconductor packages 2003, and dynamic random-access memory (DRAM) 2004.

The main substrate 2001 may include a connector 2006 including a plurality of pins to be coupled to an external host. The number and arrangement of the plurality of pins in the connector 2006 may differ depending on the communication interface between the electronic system 2000 and the external host. In some embodiments, the electronic system 2000 may communicate with the external host according to one or more interfaces from among USB, peripheral component interconnect express (PCI-Express), serial advanced technology attachment (SATA), M-PHY for universal flash storage (UFS), and the like. In some embodiments, the electronic system 2000 may be operated by power supplied from the external host through the connector 2006. The electronic system 2000 may further include a power management integrated circuit (PMIC) for distributing the power supplied from the external host, to the controller 2002 and the semiconductor package 2003. The semiconductor package 2003 and the DRAM 2004 may be connected to the controller 2002 by a plurality of conductive interconnect patterns 2005 formed on the main substrate 2001.

The controller 2002 may record and/or read data on or from the semiconductor package 2003, and/or improve the operation speed of the electronic system 2000.

The DRAM 2004 may include a buffer memory for mitigating a difference in speed between the semiconductor package 2003, which is a data storage space, and the external host. The DRAM 2004 included in the electronic system 2000 may also operate as a kind of cache memory and provide a space for temporarily storing data in a control operation of the semiconductor package 2003. When the DRAM 2004 is included in the electronic system 2000, the controller 2002 may further include a DRAM controller for controlling the DRAM 2004, in addition to a NAND controller for controlling the semiconductor package 2003.

The semiconductor package 2003 may include first and second semiconductor packages 2003a and 2003b that are spaced apart from each other. Each of the first and second semiconductor packages 2003a and 2003b may include a semiconductor package including a plurality of semiconductor chips 2200. Each of the first and second semiconductor packages 2003a and 2003b may include a package substrate 2100, the plurality of semiconductor chips 2200 on the package substrate 2100, an adhesive layer 2300 arranged on a lower surface of each of the plurality of semiconductor chips 2200, a connection structure 2400 electrically connecting the plurality of semiconductor chips 2200 and the package substrate 2100 to each other, and a molding layer 2500 covering or overlapping the plurality of semiconductor chips 2200 and the connection structure 2400 on the package substrate 2100.

The package substrate 2100 may include a printed circuit substrate including a plurality of package upper pads 2130. Each of the plurality of semiconductor chips 2200 may include an input/output pad 2201. The input/output pad 2201 may correspond to the input/output pad 1101 in FIG. 9. Each of the plurality of semiconductor chips 2200 may include a plurality of gate stacks 3210 and a plurality of channel structures 3220. The plurality of semiconductor chips 2200 may include at least one of the integrated circuit devices 100, 100a, and 100b described above with reference to FIGS. 3 to 7.

In some embodiments, the connection structure 2400 may include a bonding wire for electrically connecting the input/output pad 2201 and the package upper pad 2130 to each other. Thus, in the first and second semiconductor packages 2003a and 2003b, the plurality of semiconductor chips 2200 may be electrically connected to one another using a bonding wire method, and may be electrically connected to the plurality of package upper pads 2130 of the package substrate 2100. In some embodiments, in the first and second semiconductor packages 2003a and 2003b, the plurality of semiconductor chips 2200 may be electrically connected to one another using a connection structure including a through silicon via (TSV) instead of the connection structure 2400 using the bonding wire method.

In some embodiments, the controller 2002 and the plurality of semiconductor chips 2200 may be included in one package. In some embodiments, the controller 2002 and the plurality of semiconductor chips 2200 may be mounted on a separate interposer substrate other than the main substrate 2001, and the controller 2002 and the plurality of semiconductor chips 2200 may be connected to each other by a line formed on the interposer substrate.

Figure 11:
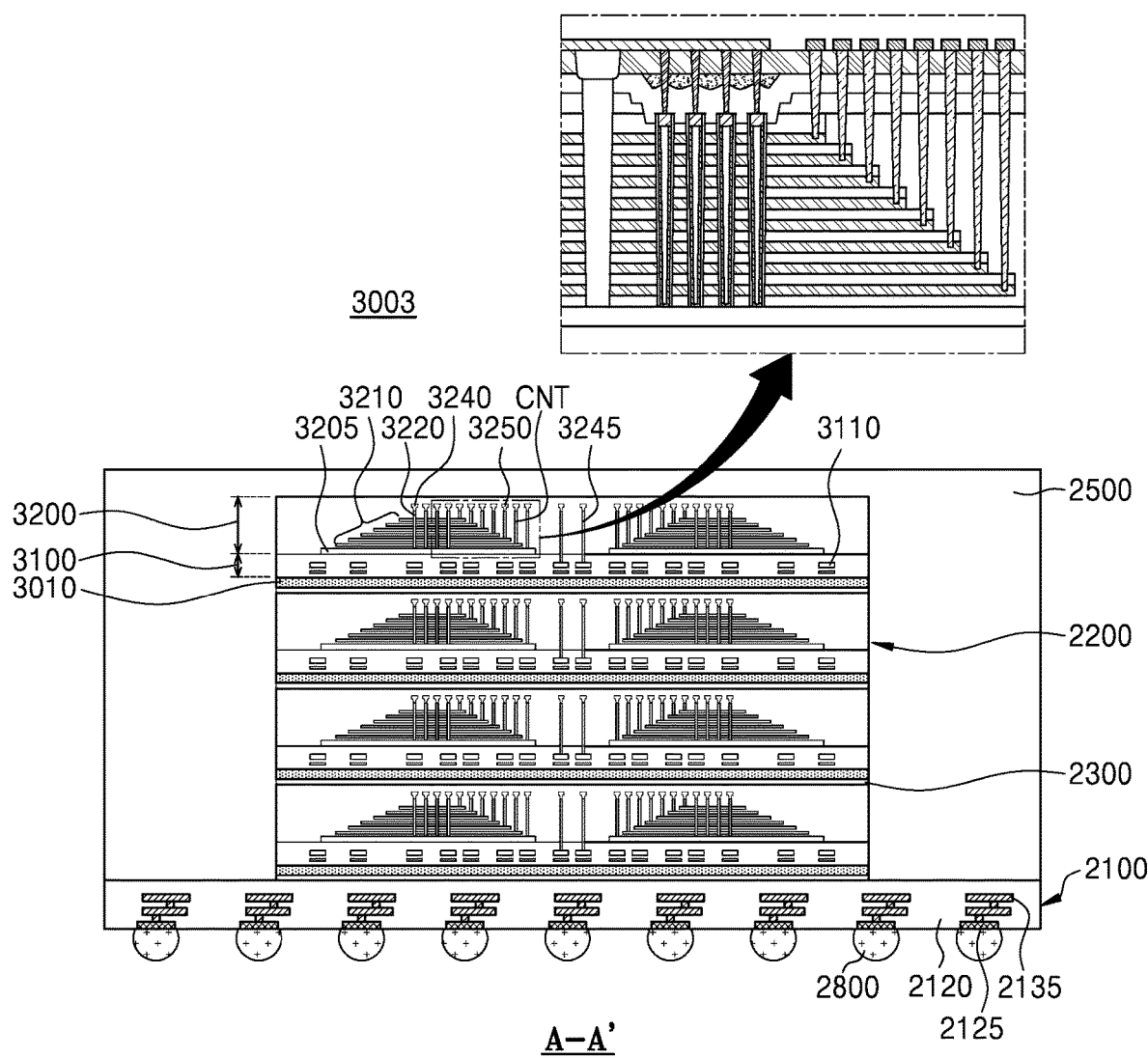
FIG. 11 is a cross-sectional view of a semiconductor package including an integrated circuit device according to example embodiments of the inventive concept.
Figure 12:
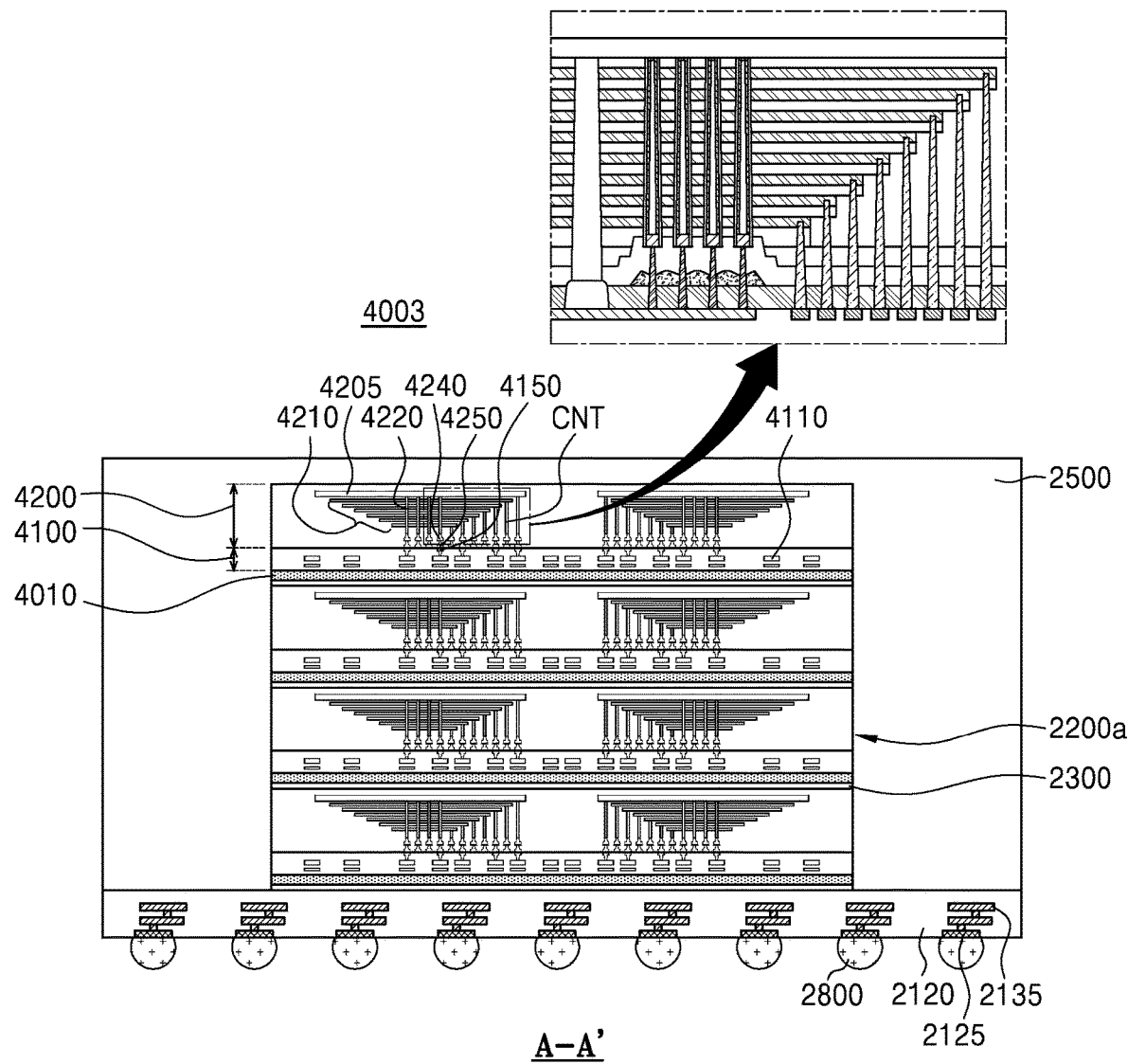
FIG. 12 is a cross-sectional view of a semiconductor package including an integrated circuit device according to example embodiments of the inventive concept.

FIGS. 11 and 12 are cross-sectional views of semiconductor packages 3003 and 4003 including an integrated circuit device according to example embodiments of the inventive concept.

Specifically, FIGS. 11 and 12 show a detailed configuration of a cross-section taken along line A-A' in FIG. 10.

Referring to FIG. 11, in the semiconductor package 3003, the package substrate 2100 may include a printed circuit substrate.

The package substrate 2100 may include a body portion 2120, a plurality of package upper pads 2130 (see FIG. 10) arranged on an upper surface of the body portion 2120, a plurality of lower pads 2125 arranged on or exposed through a lower surface of the body portion 2120, and a plurality of internal lines 2135 electrically connecting the plurality of package upper pads 2130 and the plurality of lower pads 2125 to each other within the body portion 2120. The plurality of package upper pads 2130 may be electrically connected to a plurality of connection structures 2400 (see FIG. 10). The plurality of lower pads 2125 may be connected to the plurality of conductive interconnect patterns 2005 on the main substrate 2001 of the electronic system 2000 shown in FIG. 10 through a plurality of conductive connection portions 2800.

Each of the plurality of semiconductor chips 2200 may include a semiconductor substrate 3010, and a first structure 3100 and a second structure 3200 that are sequentially stacked on the semiconductor substrate 3010. The first structure 3100 may include a peripheral circuit region including a plurality of peripheral lines 3110. As described with reference to FIG. 7, the first structure 3100 may include the peripheral circuit transistor 60TR. In FIG. 11, the first structure 3100 has the same structure as the peripheral circuit region of the integrated circuit device 100b shown in FIG. 7, but the technical idea of the inventive concept is not limited thereto.

The second structure 3200 may include a common source line 3205, a gate stack 3210 on the common source line 3205, a channel structure 3220 penetrating through the gate stack 3210, and a bit line 3240 electrically connected to the channel structure 3220.

Each of the plurality of semiconductor chips 2200 may include a through-line 3245 electrically connected to the plurality of peripheral lines 3110 of the first structure 3100 and extending into the second structure 3200. The through-line 3245 may be arranged outside the gate stack 3210. In other embodiments, the semiconductor package 3003 may further include a through-line penetrating through the gate stack 3210. Each of the plurality of semiconductor chips 2200 may further include the input/output pad 2201 (see FIG. 10) electrically connected to the plurality of peripheral lines 3110 of the first structure 3100.

Referring to FIG. 12, the semiconductor package 4003 has a similar configuration as that of the semiconductor package 3003 described with reference to FIG. 11.

The semiconductor package 4003 may include a plurality of semiconductor chips 2200a. Each of the plurality of semiconductor chips 2200a may include a semiconductor substrate 4010, a first structure 4100 on the semiconductor substrate 4010, and a second structure 4200 bonded to the first structure 4100 on the first structure 4100 by using a wafer bonding method.

The first structure 4100 may include a peripheral circuit region including a peripheral line 4110 and a plurality of first bonding structures 4150. As described with reference to FIG. 7, the first structure 4100 may include the peripheral circuit transistor 60TR. In FIG. 12, the first structure 4100 has the same structure as the peripheral circuit region of the integrated circuit device 100b shown in FIG. 7, but the technical idea of the inventive concept is not limited thereto.

The second structure 4200 may include a common source line 4205, a gate stack 4210 between the common source line 4205 and the first structure 4100, and a channel structure 4220 penetrating through the gate stack 4210.

In addition, each of the plurality of semiconductor chips 2200a may include a plurality of second bonding structures 4250 electrically connected to the plurality of gate electrodes 130 (see FIG. 4), respectively. For example, a portion of the plurality of second bonding structures 4250 may be configured to be connected to a bit line 4240 electrically connected to the channel structure 4220. The other portion of the plurality of second bonding structures 4250 may be configured to be electrically connected to the gate electrode 130 through a plurality of contact structures CNT.

The plurality of first bonding structures 4150 of the first structure 4100 and the plurality of second bonding structures 4250 of the second structure 4200 may be in contact with each other and bonded. Portions at which the plurality of first bonding structures 4150 and the plurality of second bonding structures 4250 are bonded to each other may include metal, for example, copper (Cu), but are not limited thereto.

According to the example embodiments of the inventive concept, a portion of each of the plurality of channel structures 160 may be used as an alignment structure for a photolithography process in the manufacturing process of an integrated circuit device, and thus, an alignment defect issue occurring in the photolithography process may be reduced.

In addition, according to the example embodiments of the inventive concept, the key opening 172 exposing a portion of each of the plurality of channel structures 160 is formed through primary and secondary etching processes that are sequentially performed, and thus, a sidewall of the first upper insulating layer 170 defining the key opening 172 may have a gentle slope. Accordingly, the lower mask layer 211 (see FIG. 8H) filling the key opening 172 of the first upper insulating layer 170 also has a sidewall having a gentle slope, thus removing a coating defect issue in the upper mask layer 213 (see FIG. 8H) coated on the lower mask layer 211.

While the inventive concept has been particularly shown and described with reference to embodiments thereof, it will be understood that various changes in form and details may be made therein without departing from the spirit and scope of the following claims.

What is claimed is:

1. An integrated circuit device comprising:
   a base structure;
   a gate stack on the base structure, wherein the gate stack comprises a plurality of gate electrodes spaced apart from each other in a first direction perpendicular to a main surface of the base structure;
   a first upper insulating layer on the gate stack;
   a plurality of channel structures that penetrate the gate stack and contact the base structure, wherein each of the plurality of channel structures comprises a respective alignment key that protrudes from the gate stack;
   a second upper insulating layer that is in a key opening of the first upper insulating layer and overlaps the respective alignment key of each of the plurality of channel structures;
   a top supporting layer on the second upper insulating layer;
   a bit line on the top supporting layer; and
   a plurality of bit line contacts that penetrate the second upper insulating layer and the top supporting layer and electrically connect respective ones of the plurality of channel structures to the bit line,
   wherein a sidewall defining the key opening of the first upper insulating layer comprises a first step.

2. The integrated circuit device of claim 1, wherein the sidewall of the first upper insulating layer further comprises a second step between the first step and an upper end of the sidewall of the first upper insulating layer.

3. The integrated circuit device of claim 1, further comprising:
   a buried insulating pattern that overlaps the respective alignment key of each of the plurality of channel structures in the first direction, wherein the buried insulating pattern is between the second upper insulating layer and the top supporting layer.

4. The integrated circuit device of claim 3, wherein the buried insulating pattern comprises polysilicon.

5. The integrated circuit device of claim 3, wherein the plurality of bit line contacts penetrate the buried insulating pattern.

6. The integrated circuit device of claim 3, wherein the buried insulating pattern comprises:
   an upper surface that contacts the top supporting layer;
   a lower surface that contacts the second upper insulating layer; and
   a side surface that contacts the second upper insulating layer and inclines from the lower surface of the buried insulating pattern to the upper surface of the buried insulating pattern.

7. The integrated circuit device of claim 6, wherein the upper surface of the buried insulating pattern comprises a flat surface.

8. The integrated circuit device of claim 6, wherein the lower surface of the buried insulating pattern comprises an uneven shape.

9. The integrated circuit device of claim 1,
   wherein the sidewall of the first upper insulating layer comprises a first segment, a second segment, and a third segment that are connected to one another between a lower end and an upper end of the sidewall of the first upper insulating layer,
   wherein an angle formed by an extension direction of the first segment with respect to a second direction parallel to the main surface of the base structure is greater than an angle formed by an extension direction of the second segment with respect to the second direction, and
   wherein the angle formed by the extension direction of the second segment with respect to the second direction is less than the angle formed by an extension direction of the third segment with respect to the second direction.

10. The integrated circuit device of claim 1, further comprising:
    a peripheral circuit structure on a side of the base structure that is opposite the gate stack.

11. An integrated circuit device comprising:
    a base structure;
    a gate stack on the base structure, wherein the gate stack comprises a plurality of gate electrodes spaced apart from each other in a first direction perpendicular to a main surface of the base structure;
    a plurality of channel structures that penetrate the gate stack and contact the base structure, wherein each of the plurality of channel structures comprises a respective alignment key that protrudes from the gate stack;
    a first upper insulating layer on the gate stack, wherein the first upper insulating layer comprises a key opening that overlaps the plurality of channel structures in the first direction;
    a second upper insulating layer in the key opening of the first upper insulating layer, wherein the second upper insulating layer overlaps the respective alignment key of each of the plurality of channel structures, and wherein the second upper insulating layer comprises a recessed portion at an upper side thereof;
    a buried insulating pattern in the recessed portion of the second upper insulating layer;
    a top supporting layer on the second upper insulating layer, wherein the top supporting layer is on the buried insulating pattern;
    a bit line on the top supporting layer; and
    a plurality of bit line contacts that penetrate the second upper insulating layer, the buried insulating pattern, and the top supporting layer, wherein respective ones of the plurality of bit line contacts electrically connect respective ones of the plurality of channel structures to the bit line.

12. The integrated circuit device of claim 11, wherein a sidewall defining the key opening of the first upper insulating layer comprises a first step.

13. The integrated circuit device of claim 12, wherein the sidewall of the first upper insulating layer comprises:
    a first segment that extends at a first inclination angle;
    a second segment that extends from the first segment at a second inclination angle which is less than the first inclination angle; and
    a third segment that extends from the second segment at a third inclination angle which is greater than the second inclination angle.

14. The integrated circuit device of claim 12, wherein the sidewall of the first upper insulating layer further comprises a second step between an upper end of the sidewall of the first upper insulating layer and the first step.

15. The integrated circuit device of claim 11,
    wherein the second upper insulating layer and the top supporting layer comprise silicon oxide, and
    wherein the buried insulating pattern comprises polysilicon.

16. The integrated circuit device of claim 15, wherein the buried insulating pattern comprises:
    an upper surface in contact with the top supporting layer and coplanar with an upper surface of the second upper insulating layer;
    a lower surface facing the plurality of channel structures; and
    a side surface that inclines from the lower surface of the buried insulating pattern to the upper surface of the buried insulating pattern.

17. The integrated circuit device of claim 16,
    wherein the upper surface of the buried insulating pattern comprises a flat surface, and
    wherein the lower surface of the buried insulating pattern comprises an uneven shape.

18. The integrated circuit device of claim 16, wherein the side surface of the buried insulating pattern is in contact with the second upper insulating layer.

19. An electronic system comprising:
    a main substrate;
    an integrated circuit device on the main substrate; and
    a controller on the main substrate, wherein the controller is electrically connected to the integrated circuit device,
    wherein the integrated circuit device comprises:
    a base structure;
    a peripheral circuit structure on the base structure;
    an input/output pad electrically connected to the peripheral circuit structure;
    a gate stack on the peripheral circuit structure, wherein the gate stack comprises a plurality of gate electrodes spaced apart from each other in a first direction perpendicular to a main surface of the base structure;
    a plurality of channel structures that extend in the first direction and penetrate the gate stack, each of the plurality of channel structures comprising a respective alignment key that protrudes from the gate stack;
    a first upper insulating layer on the gate stack, wherein the first upper insulating layer comprises a key opening that overlaps the plurality of channel structures in the first direction, wherein a sidewall of the key opening comprises a first step;
a second upper insulating layer in the key opening of the first upper insulating layer, wherein the second upper insulating layer is on the respective alignment key of each of the plurality of channel structures;
a top supporting layer on the second upper insulating layer;
a bit line on the top supporting layer; and
a plurality of bit line contacts that penetrate the second upper insulating layer and the top supporting layer and electrically connect respective ones of the plurality of channel structures to the bit line.

20. The electronic system of claim 19,
wherein the main substrate further comprises conductive interconnect patterns that electrically connect the integrated circuit device and the controller to each other, and
wherein the integrated circuit device further comprises:
a buried insulating pattern between the second upper insulating layer and the top supporting layer, wherein the buried insulating pattern is in a recessed portion of the second upper insulating layer; and
wherein a side surface of the buried insulating pattern inclines from the top supporting layer towards a lower surface of the second upper insulating layer.

* * * * *